(12) United States Patent
Kidoh et al.

(10) Patent No.: US 8,013,383 B2
(45) Date of Patent: Sep. 6, 2011

(54) NONVOLATILE SEMICONDUCTOR STORAGE DEVICE INCLUDING A PLURALITY OF MEMORY STRINGS

(75) Inventors: Masaru Kidoh, Komae (JP); Masaru Kito, Yokohama (JP); Ryota Katsumata, Yokohama (JP); Yoshiaki Fukuzumi, Yokohama (JP); Hiroyasu Tanaka, Tokyo (JP); Megumi Ishiduki, Yokohama (JP); Yosuke Komori, Yokohama (JP); Hideaki Aochi, Kawasaki (JP); Akihiro Nitayama, Yokohama (JP); Hitoshi Ito, Yokohama (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 12/389,856

(22) Filed: Feb. 20, 2009

(65) Prior Publication Data

US 2009/0212350 A1 Aug. 27, 2009

(30) Foreign Application Priority Data

Feb. 25, 2008 (JP) .................................. 2008-043530

(51) Int. Cl.
*H01L 29/792* (2006.01)

(52) U.S. Cl. .......................... 257/324; 257/331; 438/591

(58) Field of Classification Search .................. 257/324, 257/331, E29.309; 438/591
See application file for complete search history.

(56) References Cited

U.S. PATENT DOCUMENTS

| | | | |
|---|---|---|---|
| 5,599,724 A | 2/1997 | Yoshida | |
| 5,707,885 A | 1/1998 | Lim | |
| 7,745,312 B2 * | 6/2010 | Herner et al. | 438/479 |
| 7,847,342 B2 * | 12/2010 | Fukuzumi et al. | 257/324 |
| 7,863,672 B2 * | 1/2011 | Jin et al. | 257/319 |
| 2007/0252201 A1 | 11/2007 | Kito et al. | |
| 2009/0146190 A1 * | 6/2009 | Fukuzumi et al. | 257/204 |

FOREIGN PATENT DOCUMENTS

JP 2007-266143 10/2007

OTHER PUBLICATIONS

U.S. Appl. No. 12/883,757, filed Sep. 16, 2010, Kidoh, et al.
U.S. Appl. No. 12/714,905, filed Mar. 1, 2010, Fukuzumi, et al.

* cited by examiner

*Primary Examiner* — Phuc T Dang
(74) *Attorney, Agent, or Firm* — Oblon, Spivak, McClelland, Maier & Neustadt, L.L.P.

(57) ABSTRACT

A nonvolatile semiconductor storage device has a plurality of memory strings in which a plurality of electrically rewritable memory cells are connected in series. The memory string has a columnar semiconductor layer extending in a direction perpendicular to a substrate; a conductive layer formed so as to sandwich a charge storing layer in cooperation with the columnar semiconductor layer; and a metal layer formed so as to be in contact with the top face of the conductive layer.

11 Claims, 25 Drawing Sheets

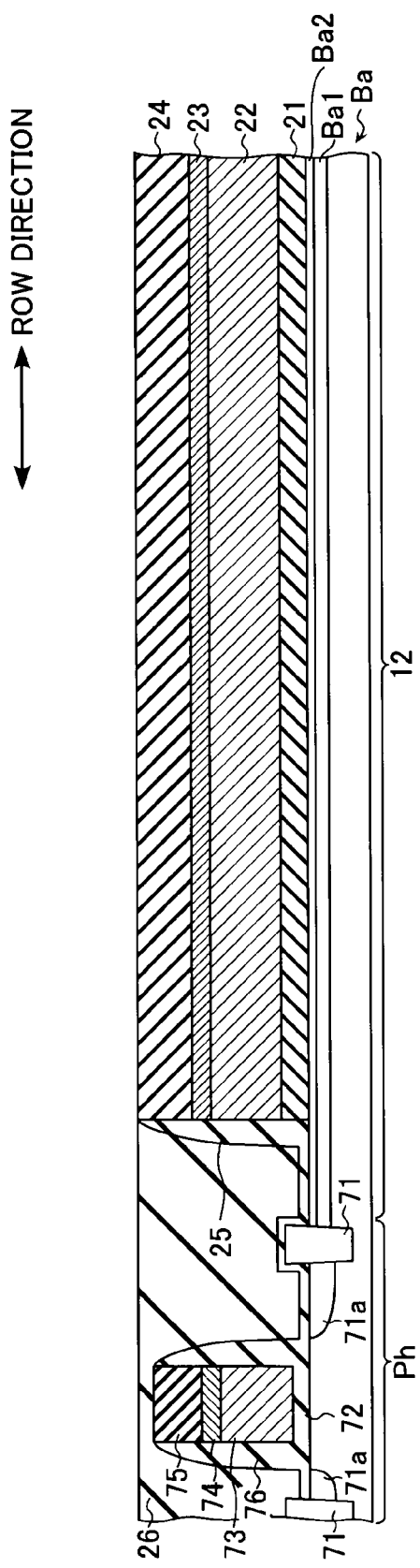

NONVOLATILE SEMICONDUCTOR STORAGE DEVICE INCLUDING A PLURALITY OF MEMORY STRINGS

CROSS-REFERENCE TO RELATED APPLICATIONS

This application is based upon and claims the benefit of priority from the prior Japanese Patent Application No. 2008-43530, filed on Feb. 25, 2008, the entire contents of which are incorporated herein by reference.

BACKGROUND OF THE INVENTION

1. Field of the Invention

The present invention relates to an electrically rewritable nonvolatile semiconductor storage device and a method of manufacturing the same.

2. Description of the Related Art

Conventionally, an LSI is formed by integrating elements in a two-dimensional plane on a silicon substrate. To increase storage capacity of a memory, the dimensions of each element have to be decreased (miniaturized). In recent years, however, it is becoming difficult to realize the miniaturization from the viewpoint of cost and techniques. For miniaturization, the technique of photolithography has to be improved. For example, in the present ArF immersion exposure technique, the rule around 40 nm is the resolution limit. For further miniaturization, it is necessary to introduce an EUV exposure device. However, the cost of an EUV exposure device is high and it is unrealistic to introduce the EUV exposure device when the cost is considered. Even if miniaturization is achieved, as long as the drive voltage is not scaled, it is expected that breakdown voltage or the like in elements reaches a physical limit point. That is, there is the high possibility that operation of the device becomes difficult.

In recent years, a number of semiconductor storage devices in which memory cells are disposed three-dimensionally in order to increase integration degree of a memory are proposed (refer to Japanese Patent Application Laid-Open No. 2007-266143 and U.S. Pat. Nos. 5,599,724 and 5,707,885).

One of conventional semiconductor storage devices in which memory cells are disposed three-dimensionally is a semiconductor storage device using a transistor having a cylindrical structure. In a semiconductor storage device using a transistor having a cylindrical structure, stacked conductive layers serving as a gate electrode obtained by stacking a number of layers and a pillar-shaped columnar semiconductor are provided. The columnar semiconductor functions as a channel (body) part of a transistor. A memory gate insulating layer capable of storing charges is provided around the columnar semiconductor. The configuration including the stacked conductive layer, the columnar semiconductor, and the memory gate insulating layer is called a memory string.

In a semiconductor storage device having the memory string, a plug conductive layer extending from the surface of a semiconductor storage device and reaching each of stacked conductive layers is formed. A voltage is applied to the stacked conductive layers via the plug conductive layer. In the conventional technique, however, wiring resistance of the stacked conductive layers is larger than a predetermined value, and adverse influence is exerted on the operation stability of a semiconductor storage device.

SUMMARY OF THE INVENTION

According to an aspect of the present invention, there is provided a nonvolatile semiconductor storage device having a plurality of memory strings in which a plurality of electrically rewritable memory cells are connected in series, the memory string comprising: a columnar semiconductor layer extending in a direction perpendicular to a substrate; a first conductive layer formed so as to sandwich a charge storing layer in cooperation with the columnar semiconductor layer; a second conductive layer positioned below the first conductive layer and formed so as to sandwich a first insulating layer in cooperation with the columnar semiconductor layer; a third conductive layer positioned above the first conductive layer and formed so as to sandwich a second insulating layer in cooperation with the columnar semiconductor layer; and a metal layer formed so as to be in contact with at least one of the first, second, and third conductive layers.

According to another aspect of the present invention, there is provided a nonvolatile semiconductor storage device having a plurality of memory strings in which a plurality of electrically rewritable memory cells are connected in series, the memory string comprising: a columnar semiconductor layer extending in a direction perpendicular to a substrate; a conductive layer formed so as to sandwich a charge storing layer in cooperation with the columnar semiconductor layer; and a metal layer formed so as to be in contact with the top face of the conductive layer.

According to another aspect of the present invention, there is provided a method of manufacturing a nonvolatile semiconductor storage device having a plurality of memory strings in which a plurality of electrically rewritable memory cells are connected in series, comprising: sequentially stacking a first interlayer insulating layer, a first conductive layer, and a first metal layer; forming a first hole so as to penetrate the first interlayer insulating layer, the first conductive layer, and the first metal layer; and forming a first columnar semiconductor layer via an insulating layer and a charge storing layer in the first hole.

BRIEF DESCRIPTION OF THE DRAWINGS

FIG. 6 is a manufacturing process cross sectional-view of the nonvolatile semiconductor storage device in the first embodiment.

DETAILED DESCRIPTION OF THE EMBODIMENTS

Embodiments of a nonvolatile semiconductor storage device of the present invention will be described below with reference to the accompanying drawings.

First Embodiment

Figure 1:
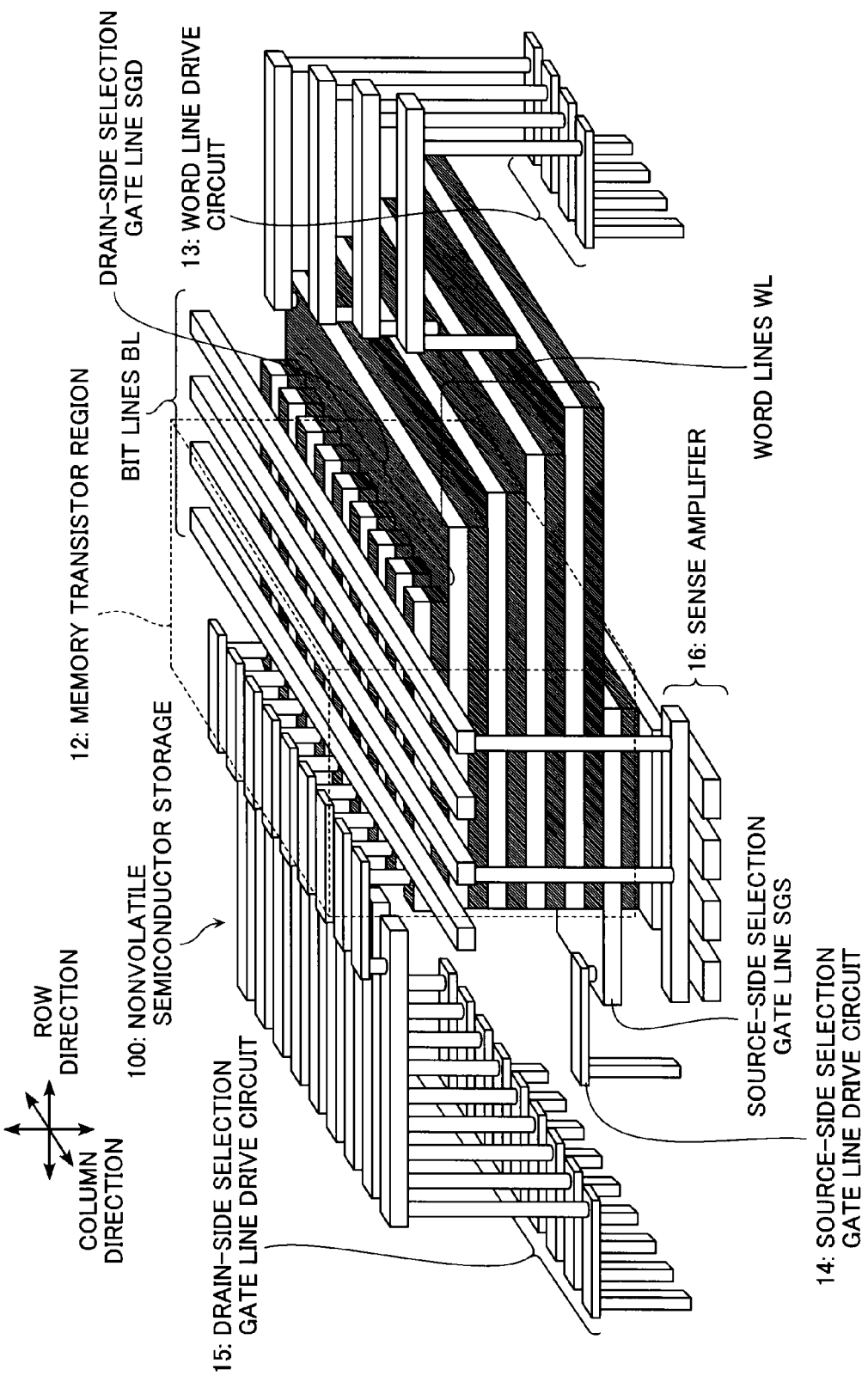
FIG. 1 is a schematic diagram showing the configuration of a nonvolatile semiconductor storage device as a first embodiment of the present invention.

Configuration of Nonvolatile Semiconductor Storage Device 100 in First Embodiment FIG. 1 is a schematic diagram of a nonvolatile semiconductor storage device 100 as a first embodiment of the present invention. As shown in FIG. 1, the nonvolatile semiconductor storage device 100 of the first embodiment mainly has a memory transistor region 12, a word line drive circuit 13, a source-side selection gate line (SGS) drive circuit 14, a drain-side selection gate line (SGD) drive circuit 15, and a sense amplifier 16. The memory transistor region 12 has a memory transistor for storing data. The word line drive circuit 13 controls voltage to be applied to word lines WL. The source-side selection gate line (SGS) drive circuit 14 controls voltage to be applied to a source-side selection gate line SGS. The drain-side selection gate line (SGD) drive circuit 15 controls voltage to be applied to a drain-side selection gate line (SGD). The sense amplifier 16 senses current (or potential) in the bit lines BL, amplifies it, and determines electrically stored data in the memory cell. In addition, the nonvolatile semiconductor storage device 100 of the first embodiment has a bit-line drive circuit for controlling voltage to be applied to bit lines BL, and a source-line drive circuit for controlling voltage to be applied to source lines SL (which are not shown).

As shown in FIG. 1, in the nonvolatile semiconductor storage device 100 of the first embodiment, memory transistors constructing the memory transistor region 12 are formed by stacking a plurality of semiconductor layers. As shown in FIG. 1, the word line WL in each layer is formed so as to extend two-dimensionally in the horizontal direction. The word line WL in each layer has a plate-shaped flat structure made of a single layer.

Figure 2:
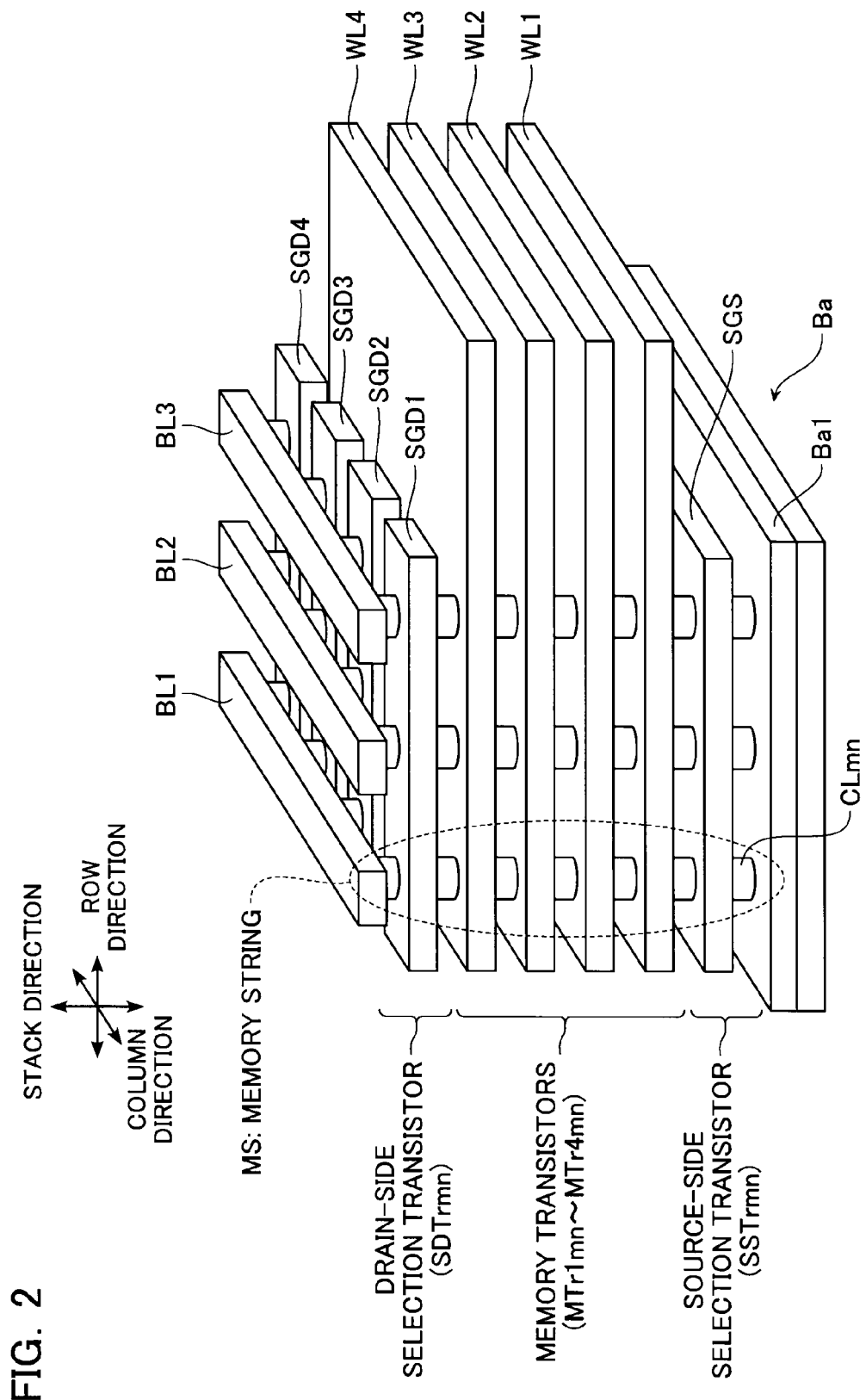
FIG. 2 is a partial schematic perspective view of a memory transistor region 12 of the nonvolatile semiconductor storage device as the first embodiment of the invention.

FIG. 2 is a partial schematic perspective view of the memory transistor region 12 of the nonvolatile semiconductor storage device 100 of the first embodiment. In the first embodiment, the memory transistor region 12 has m×n pieces (where "m" and "n" are natural numbers) of memory strings MS each made of memory transistors (MTr1$mn$ to MTr4$mn$), a source-side selection transistor SSTrmn, and a drain-side selection transistor SDTrmn. FIG. 2 shows an example where m=3 and n=4.

Each of word lines (WL1 to WL4) connected to the gates of the memory transistors (MTr1$mn$ to MTr4$mn$) in each of the memory strings MS is formed by a single conductive film and is commonly used. Specifically, all of the gates of the memory transistors MTr1$mn$ of the memory strings MS are connected to the word line WL1. All of the gates of the memory transistors MTr2$mn$ of the memory strings MS are connected to the word line WL2. All of the gates of the memory transistors MTr3$mn$ of the memory strings MS are connected to the word line WL3. All of the gates of the memory transistors MTr4$mn$ of the memory strings MS are connected to the word line WL4. In the nonvolatile semiconductor storage device 100 of the first embodiment, as shown in FIGS. 1 and 2, each of the word lines WL1 to WL4 is formed so as to extend two-dimensionally in the horizontal direction parallel with a semiconductor substrate Ba. Each of the word lines WL1 to WL4 is disposed almost perpendicular to the memory strings MS. Ends in the row direction of the word lines WL1 to WL4 are formed in a stair shape. The row direction is a direction orthogonal to the perpendicular direction, and the column direction is a direction orthogonal to the perpendicular and row directions.

Each of the memory strings MS has columnar semiconductors CLmn (in the case of FIG. 2, m=1 to 3 and n=1 to 4) on an n+ region (Ba2 which will be described later) formed in a P-well region Ba1 in the semiconductor substrate Ba. The columnar semiconductors CLmn are formed in the perpendicular direction from the semiconductor substrate Ba and are disposed in a matrix on the surface of the semiconductor substrate Ba and the word lines (WL1 to WL4). That is, the memory strings MS are also disposed in a matrix in a plane perpendicular to the columnar semiconductors CLmn. The columnar semiconductor CLmn may have a circular cylindrical shape or a prismatic shape. The columnar semiconductors CLmn include a semiconductor having a stepped column shape.

As shown in FIG. 2, in an upper part of the memory strings MS, drain-side selection gate lines SGD (in the case of FIG. 2, SGD1 to SGD4) each having a rectangular plate shape constructing the drain-side selection transistor SDTrmn, in connection to the columnar semiconductor CLmn via an insulating film (not shown). The drain-side selection gate lines SGD are isolated by insulation and are formed in line shapes extended in the row direction and repeatedly provided in the column direction in a manner different from the word lines WL1 to WL4. The columnar semiconductor CLmn is provided so as to penetrate the center in the column direction of the drain-side selection gate line SGD.

As shown in FIG. 2, in a lower part of the memory string MS, the source-side selection gate line SGS constructing the source-side selection transistor SSTrmn is provided in connection to the columnar semiconductor CLmn via an insulating film (not shown). The source-side selection gate line SGS is formed so as to extend two-dimensionally in the horizontal direction like the word lines WL1 to WL4. The source-side selection gate line SGS may also have, other than the structure as shown in FIG. 2, a stripe shape extending in the row direction and repeatedly provided in the column direction.

Figure 3:
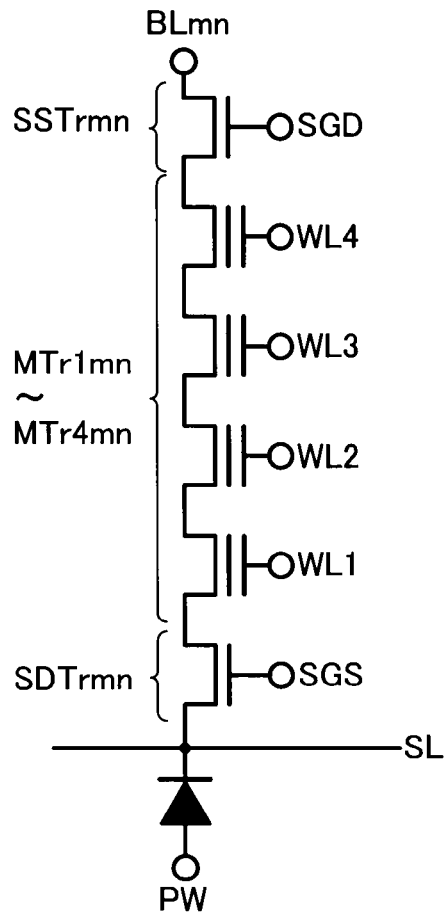
FIG. 3 is a circuit diagram of a memory string MS in the first embodiment of the invention.

With reference to FIGS. 2 and 3, a circuit configuration constructed by the memory string MS in the first embodiment and its operation will be described. FIG. 3 is a circuit diagram of one memory string MS in the first embodiment.

As shown in FIGS. 2 and 3, in the first embodiment, the memory string MS has four memory transistors MTr1$mn$ to MTr4$mn$. The four memory transistors MTr1$mn$ to MTr4$mn$, the source-side selection transistor SSTrmn, and the drain-side selection transistor SDTrmn are connected in series (refer to FIG. 3). In the memory string MS of the first embodiment, the columnar semiconductor CLmn is formed in the n+ region formed in a P− type region (P-well region) Ba1 the semiconductor substrate Ba.

The source line SL (the n+ region formed in the P-well region Ba1 in the semiconductor substrate Ba) is connected to the source of the source-side selection transistor SSTrmn. The bit line BL is connected to the drain of the drain-side selection transistor SDTrmn.

Each memory transistor MTrmn has the columnar semiconductor CLmn, a charge storage layer formed so as to surround the columnar semiconductor CLmn, and the word line WL formed so as to surround the charge storage layer. The word line WL functions as a control gate electrode of the memory transistor MTrmn.

In the nonvolatile semiconductor storage device 100 having the configuration, voltages of the bit lines BL1 to BL3, the drain-side selection gate line SGD, the word lines WL1 to WL4, the source-side selection gate line SGS, and the source line SL are controlled by a bit line drive circuit (not shown), the drain-side selection gate line drive circuit 15, the word line drive circuit 13, the source-side selection gate line drive circuit 14, and a source-line drive circuit (not shown), respectively. That is, by controlling charges in the charge storage layer in a predetermined memory transistor MTrmn, reading, writing, and erasing of data is executed.

(Concrete Configuration of Nonvolatile Semiconductor Storage Device 100 in First Embodiment)

Figure 4:
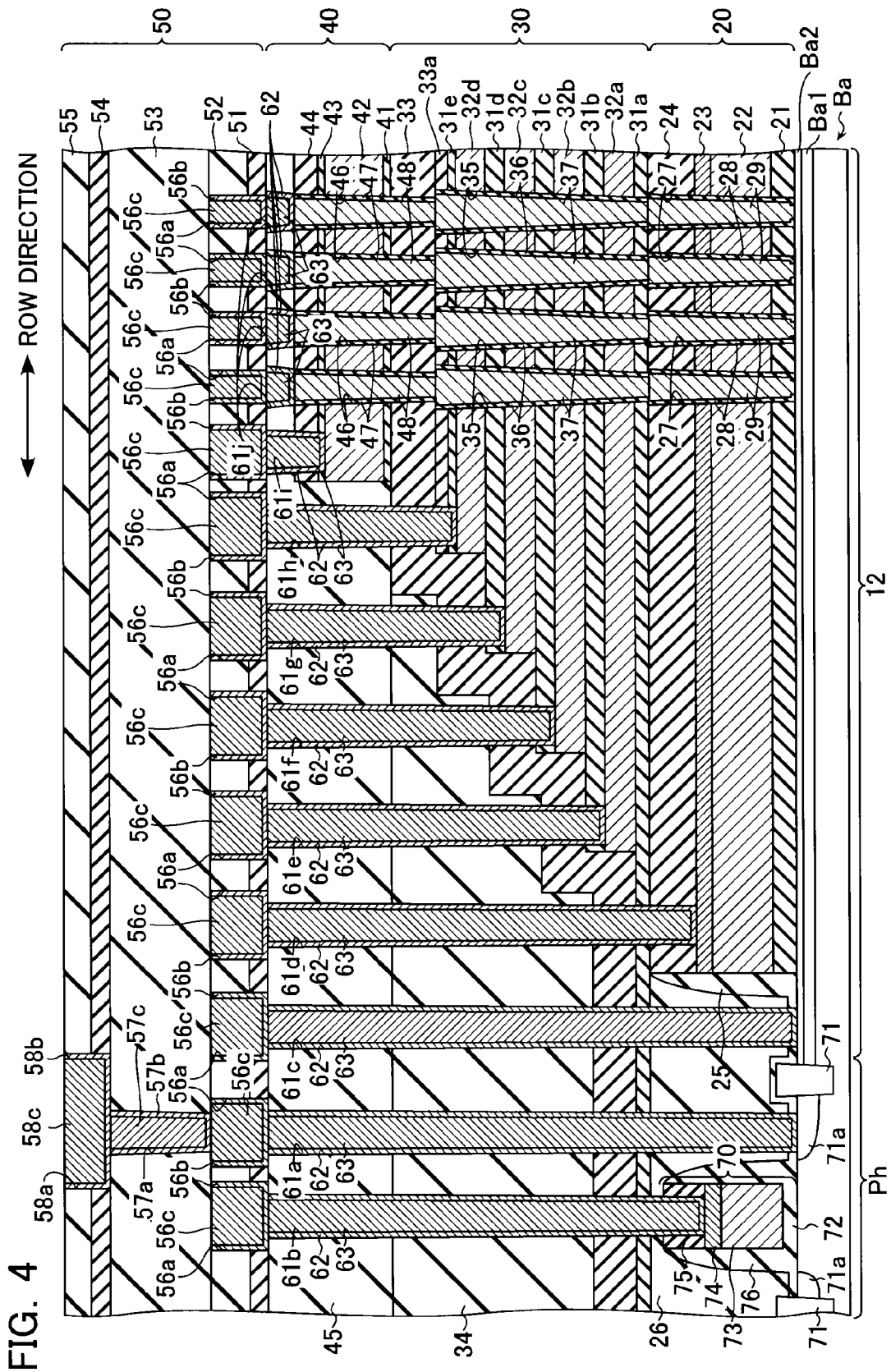
FIG. 4 is a cross sectional-view of the nonvolatile semiconductor storage device in the first embodiment.

With reference to FIG. 4, a more concrete configuration of the nonvolatile semiconductor storage device 100 will be described. FIG. 4 is a cross sectional-view in the row direction of the nonvolatile semiconductor storage device in the first embodiment. As shown in FIG. 4, the nonvolatile semiconductor storage device 100 (the memory string MS) has, in the memory transistor region 12, a source-side selection transistor layer 20, a memory transistor layer 30, a drain-side selection transistor layer 40, and a wiring layer 50 in order on the semiconductor substrate Ba. The source-side selection transistor layer 20 functions as the source-side selection transistor SSTrmn. The memory transistor layer 30 functions as the memory transistor MTrmn. The drain-side selection transistor layer 40 functions as the drain-side selection transistor SDTrmn. The nonvolatile semiconductor storage device 100 has a peripheral transistor layer 70 on the semiconductor substrate Ba in a peripheral region Ph in the periphery of the memory transistor region 12.

On the semiconductor substrate Ba, the P− type region (P-well region) Ba1 is formed. On the P− type region Ba1, the n+ region (source line region) Ba2 is formed.

The source-side selection transistor layer 20 has a source-side first insulating layer 21, a source-side conductive layer 22, a source-side metal layer 23, and a source-side isolation/insulating layer 24 which are sequentially stacked on the semiconductor substrate Ba. In other words, the source-side metal layer 23 is formed in contact with the top face of the source-side conductive layer 22.

The source-side first insulating layer 21, the source-side conductive layer 22, the source-side metal layer 23, and the source-side isolation/insulating layer 24 are formed in the memory transistor region 12 so as to extend two-dimensionally in the horizontal direction parallel with the semiconductor substrate Ba. The source-side first insulating layer 21, the source-side conductive layer 22, the source-side metal layer 23, and the source-side isolation/insulating layer 24 are segmented every predetermined region (in erasure unit) in the memory transistor region 12. A side-wall insulating layer 25 is formed at ends in the row and column directions of the layers.

The source-side first insulating layer 21 is made of silicon oxide ($SiO_2$). The source-side conductive layer 22 is made of P+ type polysilicon (p-Si). The source-side metal layer 23 is made of tungsten silicide (WSi). The source-side isolation/insulating layer 24 is made of silicon nitride (SiN).

A source-side hole 27 is formed so as to penetrate the source-side isolation/insulating layer 24, the source-side metal layer 23, the source-side conductive layer 22, and the source-side first insulating layer 21. On the side wall facing the source-side hole 27, a source-side gate insulating layer 28 and a source-side columnar semiconductor layer 29 are provided in order. The source-side columnar semiconductor layer 29 is formed in contact with the under face of a memory columnar semiconductor layer 37 which will be described later and so as to extend below the layer 37.

The source-side gate insulating layer 28 is made of silicon oxide ($SiO_2$). The source-side columnar semiconductor layer 29 is made of polysilicon (p-Si). An upper part of the source-side columnar semiconductor layer 29 may be made of N+ type polysilicon.

In the configuration of the source-side selection transistor 20, in other words, the source-side conductive layer 22 has a configuration that the source-side conductive layer 22 and the source-side columnar semiconductor layer 29 sandwich the source-side gate insulating layer 28.

In the source-side selection transistor layer 20, the source-side conductive layer 22 functions as the source-side selection gate line SGS. The source-side conductive layer 22 functions as the control gate of the source-side selection transistor SSTrmn.

The peripheral transistor layer 70 has a gate insulating layer 72, a gate conductive layer 73, a gate metal layer 74, a plug insulating layer 75, and a side-wall insulating layer 76. On the surface of the semiconductor substrate Ba on which the peripheral transistor layer 70 is formed, a device isolation insulating layer 71 and a source/drain layer 71$a$ are formed at a predetermined pitch. The source/drain layer 71$a$ is made of impurity implanted in the semiconductor substrate Ba, and the peripheral transistor layer 70 is covered with an interlayer insulating layer 26.

The gate insulating layer 72 is formed on the semiconductor substrate Ba so as to cross the two source/drain layers 71a. The gate conductive layer 73 is formed on the gate insulating layer 72. The gate metal layer 74 is formed on the gate conductive layer 73. The plug insulating layer 75 is formed on the gate metal layer 74. The side-wall insulating layer 76 is formed so as to cover the side walls of the gate insulating layer 72, the gate conductive layer 73, the gate metal layer 74, and the plug insulating layer 75.

The gate insulating layer 72 is made of silicon oxide ($SiO_2$) The gate conductive layer 73 is made of N+ type polysilicon (p-Si). The gate metal layer 74 is made of tungsten silicide (WSi). The plug insulating layer 75 is made of silicon nitride (SiN). The side-wall insulating layer 76 and the interlayer insulating layer 26 are made of silicon oxide ($SiO_2$).

A memory transistor layer 30 has first to fifth inter-word-line insulating layers 31a to 31e provided above the source-side isolation/insulating layer 24 and the interlayer insulating layer 25, first to fourth word line conductive layers 32a to 32d provided on the first to fifth inter-wordline insulating layers 31a to 31e, respectively, and a memory isolation/insulating layer 33a and a memory protection insulating layer 33 stacked in order on the fifth word line insulting layer 31e.

The first to fifth inter-wordline insulating layers 31a to 31e, the first to fourth word line conductive layers 32a to 32d, and the memory isolation/insulating layer 33a are formed so as to extend two-dimensionally in the row and column directions and formed in a stair shape at the ends in the row direction. The memory protection insulating layer 33 is formed so as to cover the ends in the row direction and the ends in the column direction of the first to fifth inter-wordline insulating layers 31a to 31e, first to fourth word line conductive layers 32a to 32d, and memory isolation/insulating layer 33a. In the memory transistor layer 30, an interlayer insulating layer 34 is formed in the range from the upper surface of the memory protection insulting layer 33 formed on the top face of the first inter-wordline insulating layer 31a to the upper surface of the memory protection insulating layer 33 formed on the top face of the memory isolation/insulating layer 33a.

The first to fifth inter-wordline insulating layers 31a to 31e are made of silicon oxide ($SiO_2$). The first to fourth word line conductive layers 32a to 32d are made of P+ type polysilicon (p-Si). The memory isolation/insulating layer 33a and the memory protection insulating layer 33 are made of silicon nitride (SiN). The interlayer insulating layer 34 is made of silicon oxide ($SiO_2$).

In the memory transistor layer 30, a memory hole 35 is formed so as to penetrate the memory isolation/insulating layer 33a, the first to fifth inter-wordline insulating layers 31a to 31e, and the first to fourth word line conductive layers 32a to 32d. The memory hole 35 is provided in a position aligned with the source-side hole 27. On the sidewall in the memory-side hole 35, a memory gate insulating layer 36 and the memory columnar semiconductor layer 37 are provided in order. The memory columnar semiconductor layer 37 is formed so as to extend in the perpendicular direction.

Figure 5:
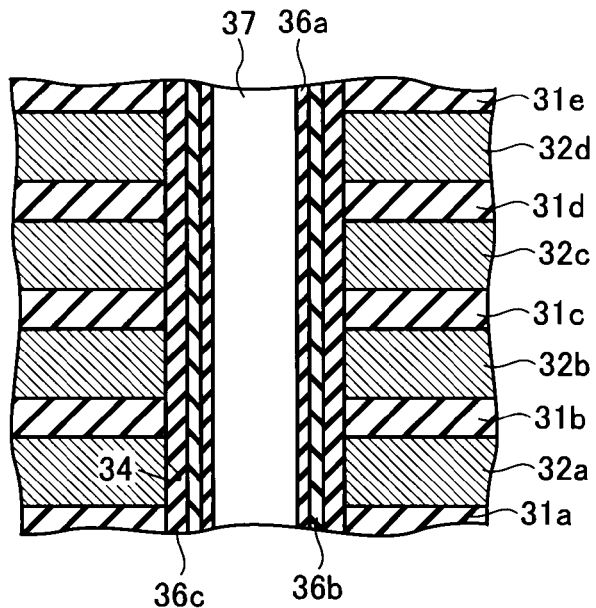
FIG. 5 is a partial enlarged view of FIG. 4.

The memory gate insulating layer 36 is constructed as shown in FIG. 5. FIG. 5 is an enlarged view of the memory transistor layer 30 shown in FIG. 4. As shown in FIG. 5, the memory gate insulating layer 36 has, from the side wall of the memory columnar semiconductor layer 37, a tunnel insulating layer 36a, a charge storage layer 36b for storing charges, and a block insulating layer 36c in order.

The tunnel insulating layer 36a and the block insulating layer 36c are made of silicon oxide ($SiO_2$). The charge storage layer 36b is made of silicon nitride (SiN). The memory columnar semiconductor layer 37 is made of polysilicon (p-Si). An upper part of the memory columnar semiconductor layer 37 may be made of N+ type polysilicon.

In the configuration of the memory transistor 30, in other words, the first to fourth word line conductive layers 32a to 32d have a configuration that the first to fourth word line conductive layers 32a to 32d and the memory columnar semiconductor layer 37 sandwich the tunnel insulating layer 36a, the charge storage layer 36b, and the block insulating layer 36c.

In the memory transistor layer 30, the first to fourth word line conductive layers 32a to 32d function as the word lines WL1 to WL4. The first to fourth word line conductive layers 32a to 32d function as the control gate of the memory transistor MTrmn.

A drain-side selection transistor layer 40 has a drain-side first insulating layer 41, a drain-side conductive layer 42, a drain-side second insulating layer 43, and a drain-side isolation/insulating layer 44 sequentially stacked on the memory protection insulating layer 33.

The drain-side first insulating layer 41, the drain-side conductive layer 42, the drain-side second insulating layer 43, and the drain-side isolation/insulating layer 44 are provided in a position aligned with the top part of the memory columnar semiconductor layer 37 and are formed to extend in the row direction and formed in lines repeatedly provided in the column direction. In the drain-side selection transistor layer 40, an interlayer insulating layer 45 is formed in the range from the surface of the interlayer insulating layer 34 to a predetermined level above the top face of the drain-side isolation/insulating layer 44.

The drain-side first insulating layer 41 and the drain-side second insulating layer 43 are made of silicon oxide ($SiO_2$). The drain-side conductive layer 42 is made of P+ type polysilicon (p-Si). The drain-side isolation/insulating layer 44 is made of silicon nitride (SiN). The interlayer insulating layer 45 is made of silicon oxide ($SiO_2$).

In the drain-side selection transistor layer 40, a drain-side hole 46 is formed so as to penetrate the drain-side isolation/insulating layer 44, the drain-side second insulating layer 43, the drain-side conductive layer 42, the drain-side first insulating layer 41, and the memory protection insulating layer 33. The drain-side hole 46 is provided in a position aligned with the memory hole 35. On the side wall facing the drain-side hole 46, a drain-side gate insulating layer 47 and a drain-side columnar semiconductor layer 48 are provided in order. The drain-side columnar semiconductor layer 48 is formed in contact with the top face of the memory columnar semiconductor layer 37 and so as to extend above the layer 37.

The drain-side gate insulating layer 47 is made of silicon oxide ($SiO_2$). The drain-side columnar semiconductor layer 48 is made of polysilicon (p-Si). An upper part of the drain-side columnar semiconductor layer 48 is made of N+ type polysilicon.

In the configuration of the drain-side selection transistor layer 40, in other words, the drain-side conductive layer 42 and the drain-side columnar semiconductor layer 48 sandwich the drain-side gate insulating layer 47.

In the drain-side selection transistor layer 40, the drain-side conductive layer 42 functions as the drain-side selection gate line SGD. The drain-side conductive layer 42 functions as the control gate of the drain-side selection transistor SDTrmn.

In the source-side selection transistor layer 20, the memory transistor layer 30, and the drain-side selection transistor layer 40, plug holes 61a to 61j are formed.

The plug hole 61a is formed so as to reach the source/drain layer 71a. That is, the plug hole 61a is formed so as to penetrate the interlayer insulating layer 45, the interlayer insulating layer 34, the memory protection insulating layer 33, the first inter-wordline insulating layer 31a, and the interlayer insulating layer 26.

The plug hole 61b is formed so as to reach the top face of the gate metal layer 74. That is, the plug hole 61b is formed so as to penetrate the interlayer insulating layer 45, the interlayer insulating layer 34, the memory protection insulating layer 33, the first inter-wordline insulating layer 31a, the interlayer insulating layer 26, and the plug insulating layer 75.

The plug hole 61c is formed so as to reach the n+ region Ba2. That is, the plug hole 61c is formed so as to penetrate the interlayer insulating layer 45, the interlayer insulating layer 34, the memory protection insulating layer 33, the first inter-wordline insulating layer 31a, and the interlayer insulating layer 26.

The plug hole 61d is formed so as to reach the top face of the source-side metal layer 23. That is, the plug hole 61d is formed so as to penetrate the interlayer insulating layer 45, the interlayer insulating layer 34, the memory protection insulating layer 33, the first inter-wordline insulating layer 31a, and the source-side isolation/insulating layer 24.

The plug holes 61e to 61h are formed so as to reach the top faces of the first to fourth word line conductive layers 32a to 32d, respectively. That is, the plug hole 61e is formed so as to penetrate the interlayer insulating layer 45, the interlayer insulating layer 34, the memory protection insulating layer 33, and the second inter-wordline insulating layer 31b. The plug hole 61f is formed so as to penetrate the interlayer insulating layer 45, the interlayer insulating layer 34, the memory protection insulating layer 33, and the third inter-wordline insulating layer 31c. The plug hole 61g is formed so as to penetrate the interlayer insulating layer 45, the interlayer insulating layer 34, the memory protection insulating layer 33, and the fourth inter-wordline insulating layer 31d. The plug hole 61h is formed so as to penetrate the interlayer insulating layer 45, the interlayer insulating layer 34, the memory protection insulating layer 33, the memory isolation/insulating layer 33a, and the fifth inter-wordline insulating layer 31e.

The plug hole 61i is formed so as to reach the top face of the drain-side conductive layer 42. That is, the plug hole 61i is formed so as to penetrate the interlayer insulating layer 45, the drain-side isolation/insulating layer 44, and the drain-side second insulating layer 43.

The plug hole 61j is formed so as to reach the drain-side columnar semiconductor layer 48. That is, the plug hole 61j is formed so as to penetrate the interlayer insulating layer 45.

On the side walls facing the plug holes 61a to 61j, a barrier metal layer 62 and a plug conductive layer 63 are formed in order. The barrier metal layer 62 is made of titanium-titanium nitride (Ti—TiN). The plug conductive layer 63 is made of tungsten (W).

A wiring layer 50 has wiring first to fifth insulating layers 51 to 55 sequentially stacked on the top face of the interlayer insulating layer 45. The wiring first insulating layer 51 and the wiring fourth insulating layer 54 are made of silicon nitride (SiN). The wiring second insulating layer 52, the wiring third insulating layer 53, and the wiring fifth insulating layer 55 are made of silicon oxide ($SiO_2$).

The wiring layer 50 has a wiring first groove 56a, a wiring plug hole 57a, and a wiring second groove 58a.

The wiring first groove 56a is formed so as to penetrate the wiring first insulating layer 51 and the wiring second insulating layer 52. The wiring first groove 56a is provided in a position aligned with the plug holes 61a to 61j.

On the side wall facing the wiring first groove 56a, a barrier metal layer 56b and a wiring first conductive layer 56c are formed in order. The barrier metal layer 56b is made of titanium-titanium nitride (Ti—TiN). The wiring first conductive layer 56c is made of tungsten (W).

The wiring plug hole 57a is formed so as to penetrate the third wiring insulating layer 53. The wiring plug hole 57a is formed in a position aligned with the wiring first groove 56a.

On the side wall facing the wiring plug hole 57a, a barrier metal layer 57b and a wiring plug conductive layer 57c are formed in order. The barrier metal layer 57b is made of titanium-titanium nitride (Ti—TiN). The wiring plug conductive layer 57c is made of tungsten (W).

The wiring second groove 58a is formed so as to penetrate the wiring fifth insulating layer 55 and the wiring fourth insulating layer 54. The wiring second groove 58a is formed in a position aligned with the wiring plug hole 57a.

On the side wall facing the wiring second groove 58a, a barrier metal layer 58b and a wiring second conductive layer 58c are formed in order. The barrier metal layer 58b is made of titanium-titanium nitride (Ti—TiN). The wiring second conductive layer 58c is made of tungsten (W).

(Manufacturing Process of Nonvolatile Semiconductor Storage Device 100 in First Embodiment)

With reference to FIGS. 6 to 22, a manufacturing process of the nonvolatile semiconductor storage device 100 in the first embodiment will be described.

First, as shown in FIG. 6, the P-well region Ba1, the n+ region BA2, and the device isolation region 71 are formed on the semiconductor substrate Ba by lithography, ion implantation, dry etching or the like. Next, silicon oxide ($SiO_2$), polysilicon (p-Si), tungsten silicide (WSi), and silicon nitride (SiN) are sequentially stacked, and lithography, dry etching, and ion implantation are performed. By the process, in the memory transistor region 12, the source-side first insulating layer 21, the source-side conductive layer 22, the source-side metal layer 23, and the source-side isolation/insulating layer 24 are formed. The peripheral transistor layer 70 is formed at the ends of the peripheral region Ph and the memory transistor region 12. Subsequently, silicon oxide ($SiO_2$) is deposited and chemical mechanical polishing (CMP) process is performed, thereby forming the interlayer insulating layer 26.

Figure 7:
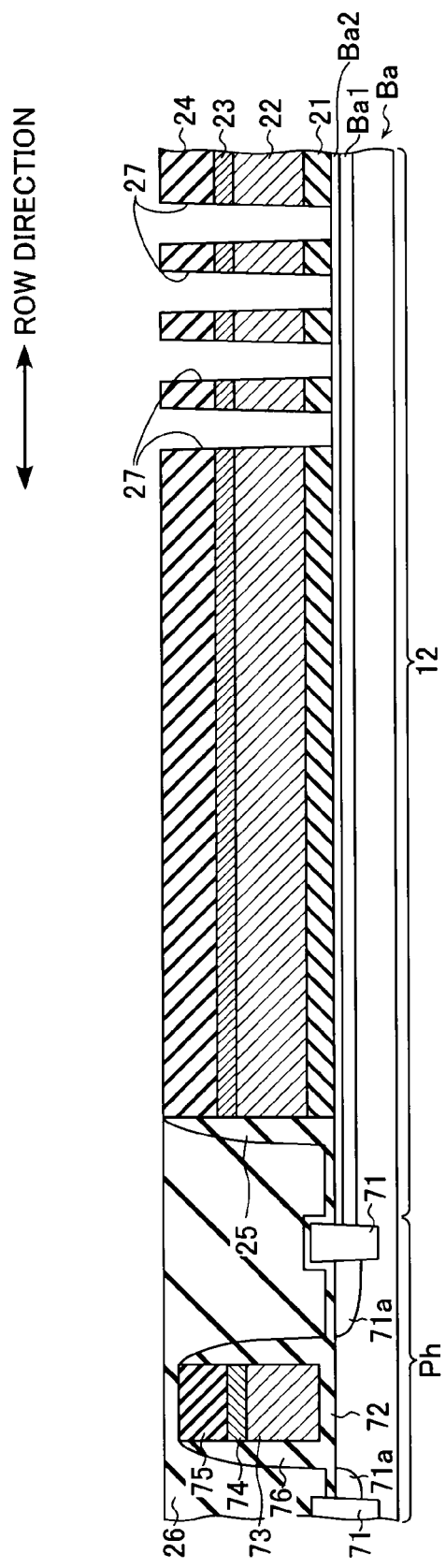
FIG. 7 is a manufacturing process cross sectional-view of the nonvolatile semiconductor storage device in the first embodiment.

As shown in FIG. 7, the source-side hole 27 is formed so as to penetrate the source-side isolation/insulating layer 24, the source-side metal layer 23, the source-side conductive layer 22, and the source-side first insulating layer 21 at predetermined pitches on the n+ region Ba2.

Figure 8:
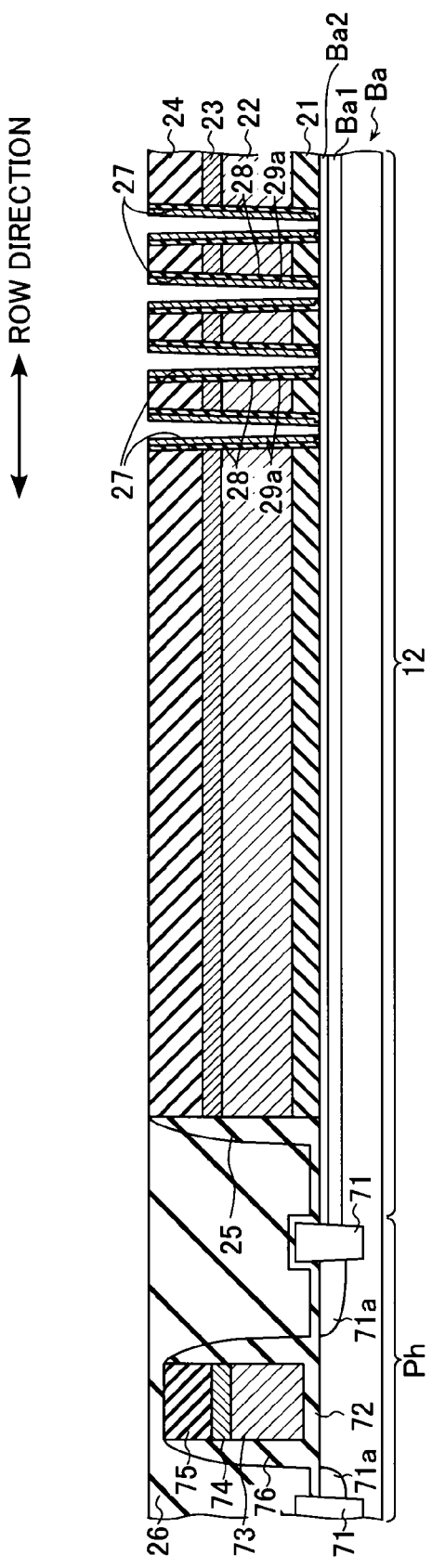
FIG. 8 is a manufacturing process cross sectional-view of the nonvolatile semiconductor storage device in the first embodiment.

Next, as shown in FIG. 8, silicon oxide ($SiO_2$) and amorphous silicon (a-Si) are deposited on the source-side hole 27. Subsequently, by reactive ion etching (RIE), the silicon oxide ($SiO_2$) and the amorphous silicon (a-Si) formed at the bottom of the source-side hole 27 are removed. By the process, the source-side gate insulating layer 28 and a spacer layer 29a are sequentially formed on the side wall facing the source-side hole 27. Subsequently, diluted hydrofluoric acid process is performed on the bottom of the source-side hole 27 to remove a native oxide film.

Figure 9:
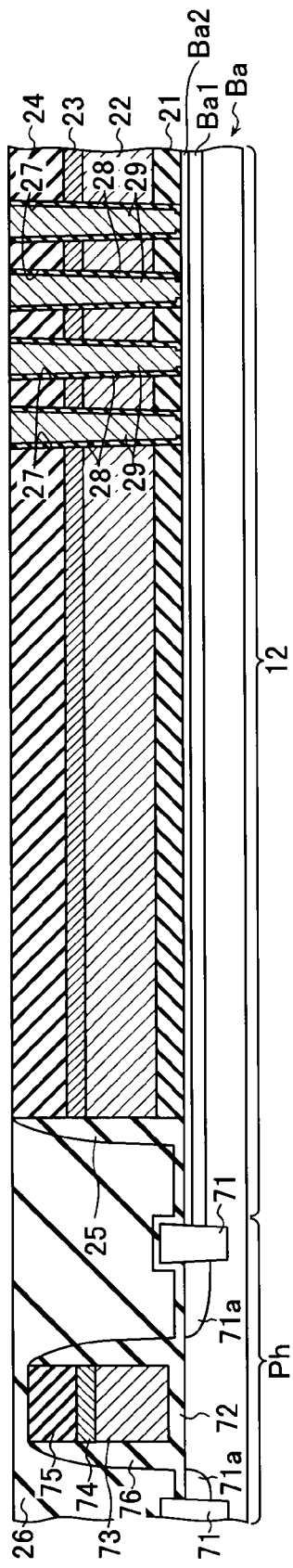
FIG. 9 is a manufacturing process cross sectional-view of the nonvolatile semiconductor storage device in the first embodiment.

As shown in FIG. 9, amorphous silicon (a-Si) is deposited so as to bury the source-side hole 27 and, after that, the RIE process and the heat treatment are performed. By the process, the source-side columnar semiconductor layer 28 is formed so as to be in contact with the source-side gate insulating layer 28 in the source-side hole 27. It is also possible to implant impurity ions at the upper end of the source-side columnar semiconductor layer 28 to form the upper part of the source-side columnar semiconductor layer 28 made of N+ type polysilicon.

Figure 10:
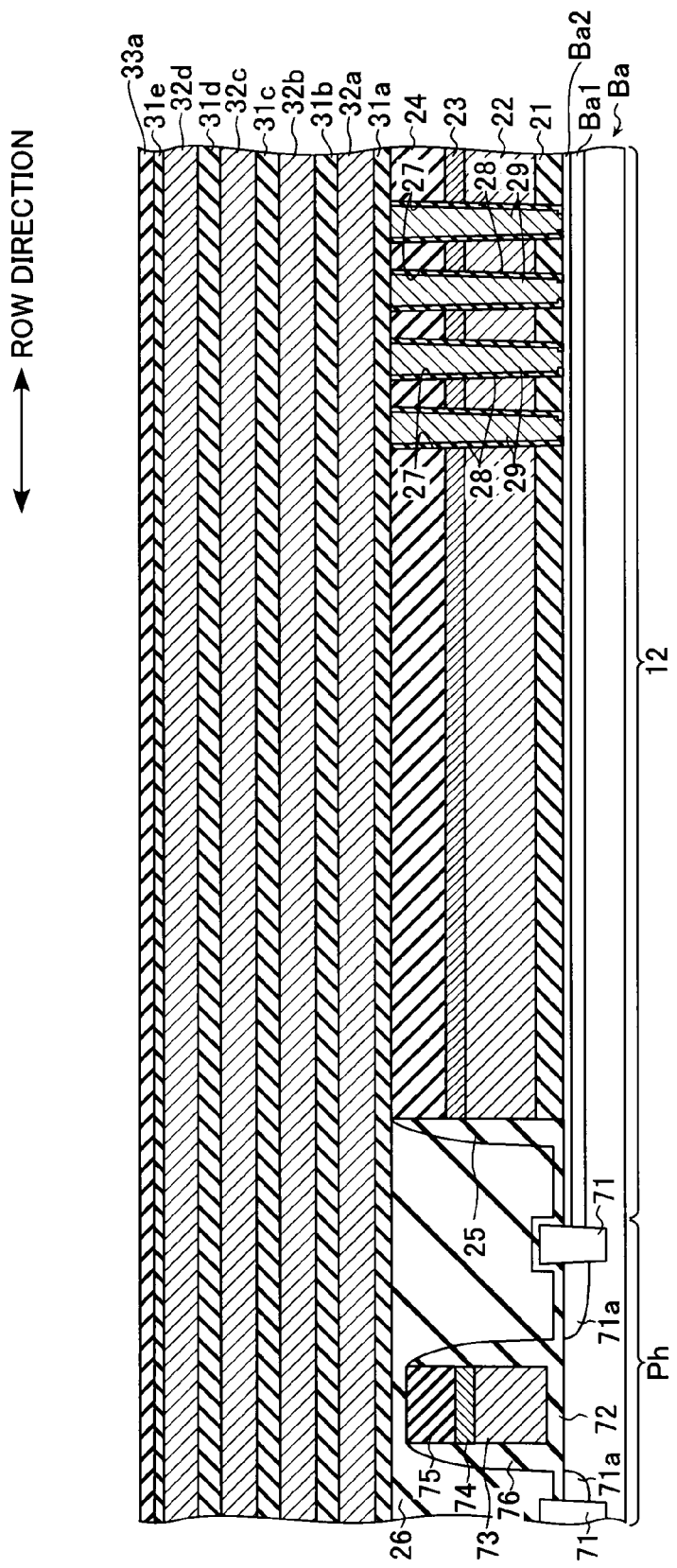
FIG. 10 is a manufacturing process cross sectional-view of the nonvolatile semiconductor storage device in the first embodiment.

As shown in FIG. 10, silicon oxide ($SiO_2$) and P+ type polysilicon (p-Si) are alternately stacked on the source-side isolation/insulating layer 24 and the interlayer insulating layer 26 and, after that, silicon nitride (SiN) is deposited, thereby forming the first to fifth inter-wordline insulating layers 31a to 31e, the first to fourth word line conductive layers 32a to 32d, and the memory isolation/insulating layer 33a.

Figure 11:
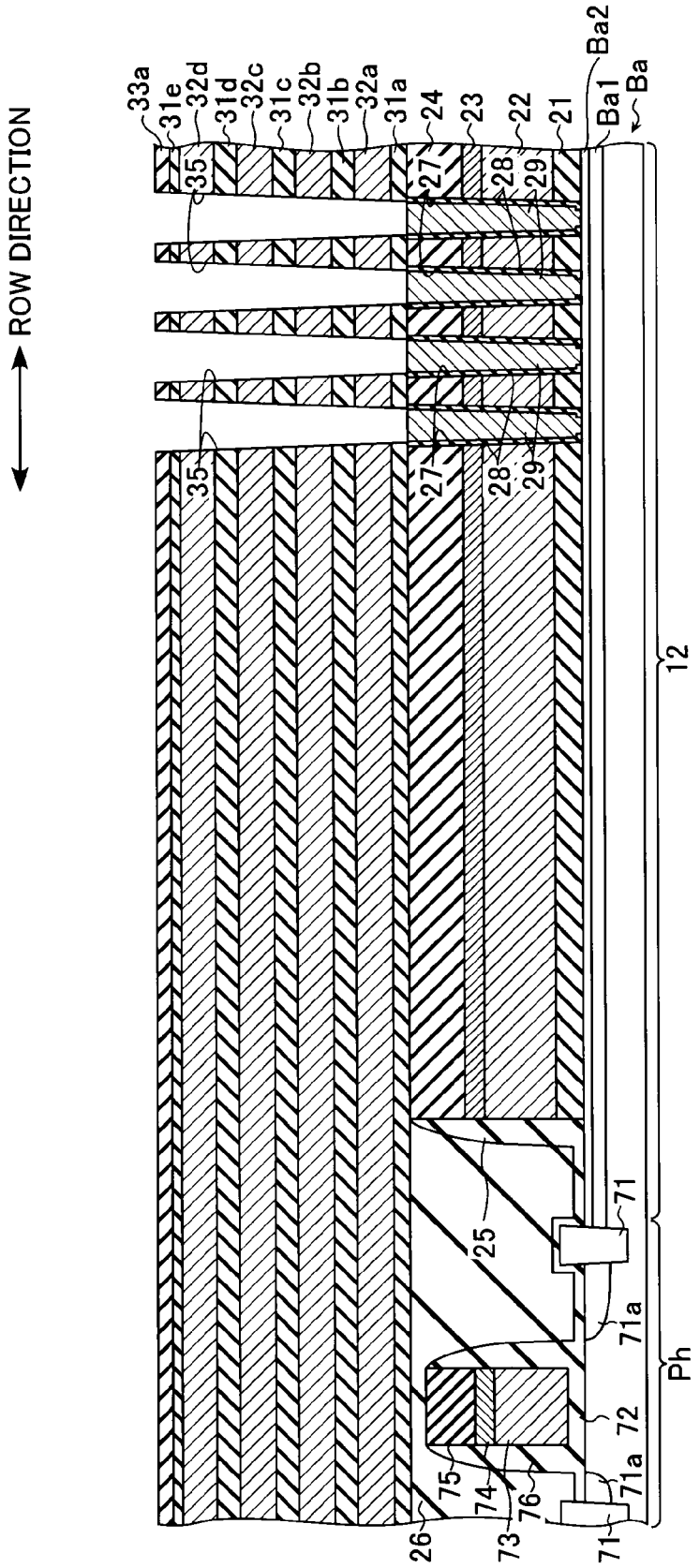
FIG. 11 is a manufacturing process cross sectional-view of the nonvolatile semiconductor storage device in the first embodiment.

As shown in FIG. 11, the memory hole 35 is formed so as to penetrate the memory isolation/insulating layer 33a, the first to fifth inter-wordline insulating layers 31a to 31e, and the first to fourth word line conductive layers 32a to 32d in a position aligned with the source-side hole 27.

Figure 12:
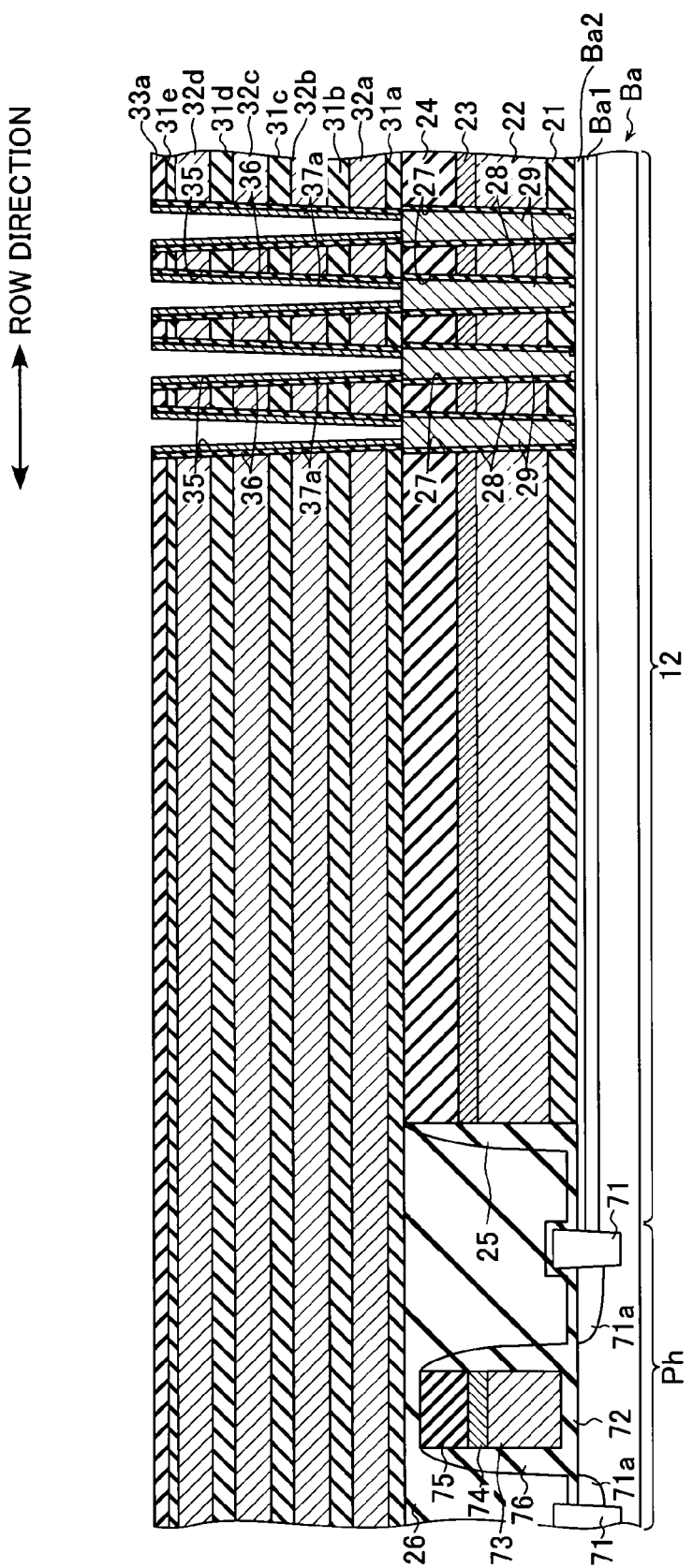
FIG. 12 is a manufacturing process cross sectional-view of the nonvolatile semiconductor storage device in the first embodiment.

As shown in FIG. 12, silicon oxide ($SiO_2$), silicon nitride (SiN), silicon oxide ($SiO_2$), and amorphous silicon (a-Si) are sequentially stacked in the memory hole 35, and the RIE process is performed. By the process, the memory gate insulating layer 36 and a spacer layer 37a are formed on the side wall facing the memory hole 35. Subsequently, the diluted hydrofluoric acid process is performed on the bottom of the memory hole 35 to remove a native oxide film.

Figure 13:
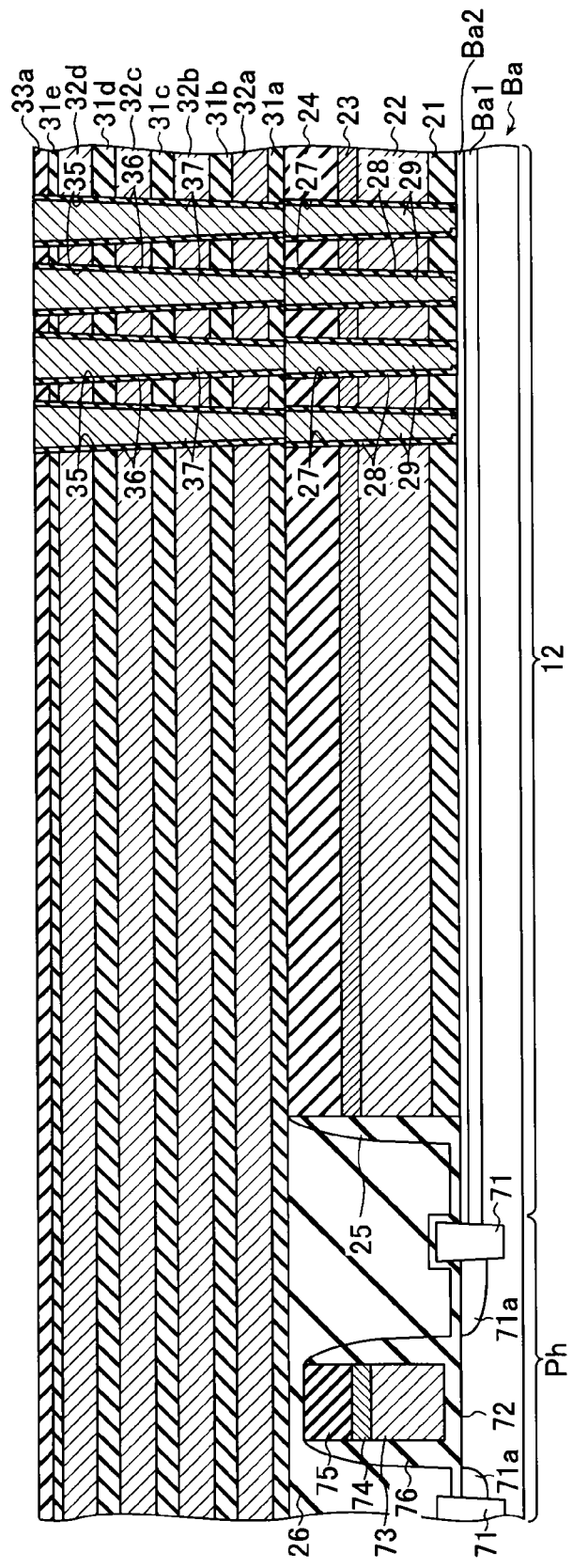
FIG. 13 is a manufacturing process cross sectional-view of the nonvolatile semiconductor storage device in the first embodiment.

Subsequently, as shown in FIG. 13, amorphous silicon (a-Si) is deposited so as to bury the memory hole 35 and, after that, the RIE process and the heat treatment are performed. By the process, the memory columnar semiconductor layer 37 is formed so as to be in contact with the memory gate insulating layer 36 in the memory hole 35. It is also possible to implant impurity ions at the upper end of the memory columnar semiconductor layer 37 to form the upper part of the memory columnar semiconductor layer 37 made of N+ type polysilicon.

Figure 14:
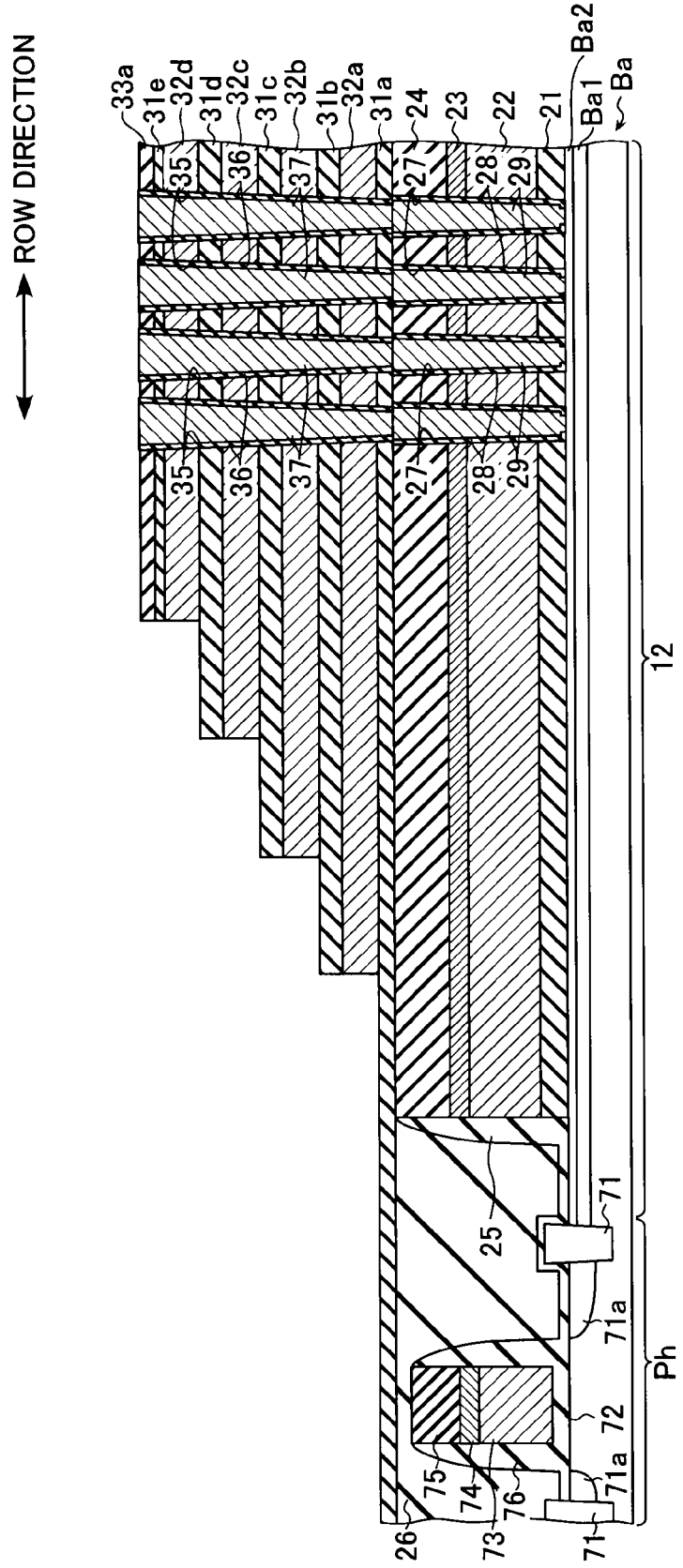
FIG. 14 is a manufacturing process cross sectional-view of the nonvolatile semiconductor storage device in the first embodiment.

As shown in FIG. 14, an end in the row direction of the memory transistor layer 30 is processed in a stair shape.

Figure 15:
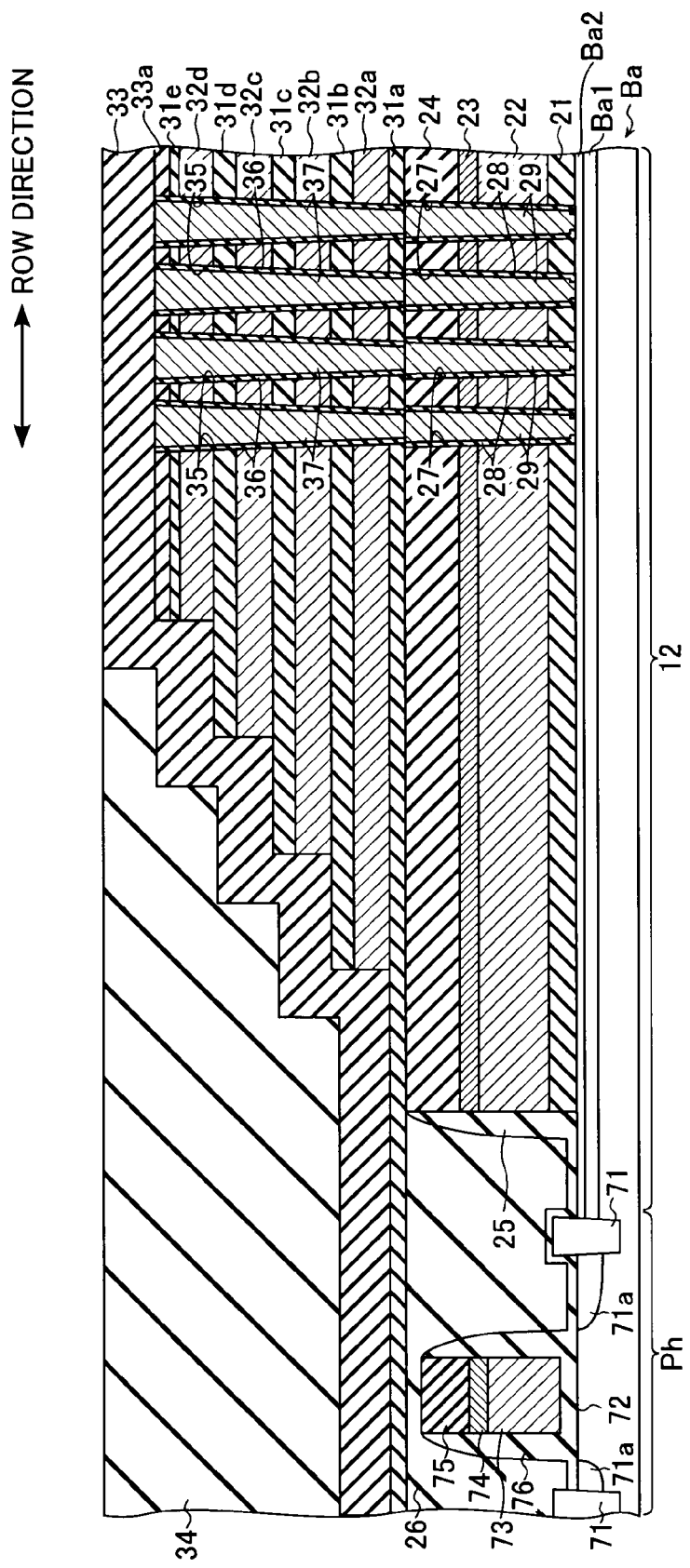
FIG. 15 is a manufacturing process cross sectional-view of the nonvolatile semiconductor storage device in the first embodiment.

Subsequently, as shown in FIG. 15, silicon nitride (SiN) and silicon oxide ($SiO_2$) are stacked and, after that, the CMP process is performed. By the process, the memory protection insulating layer 33 and the interlayer insulating layer 34 are formed.

Figure 16:
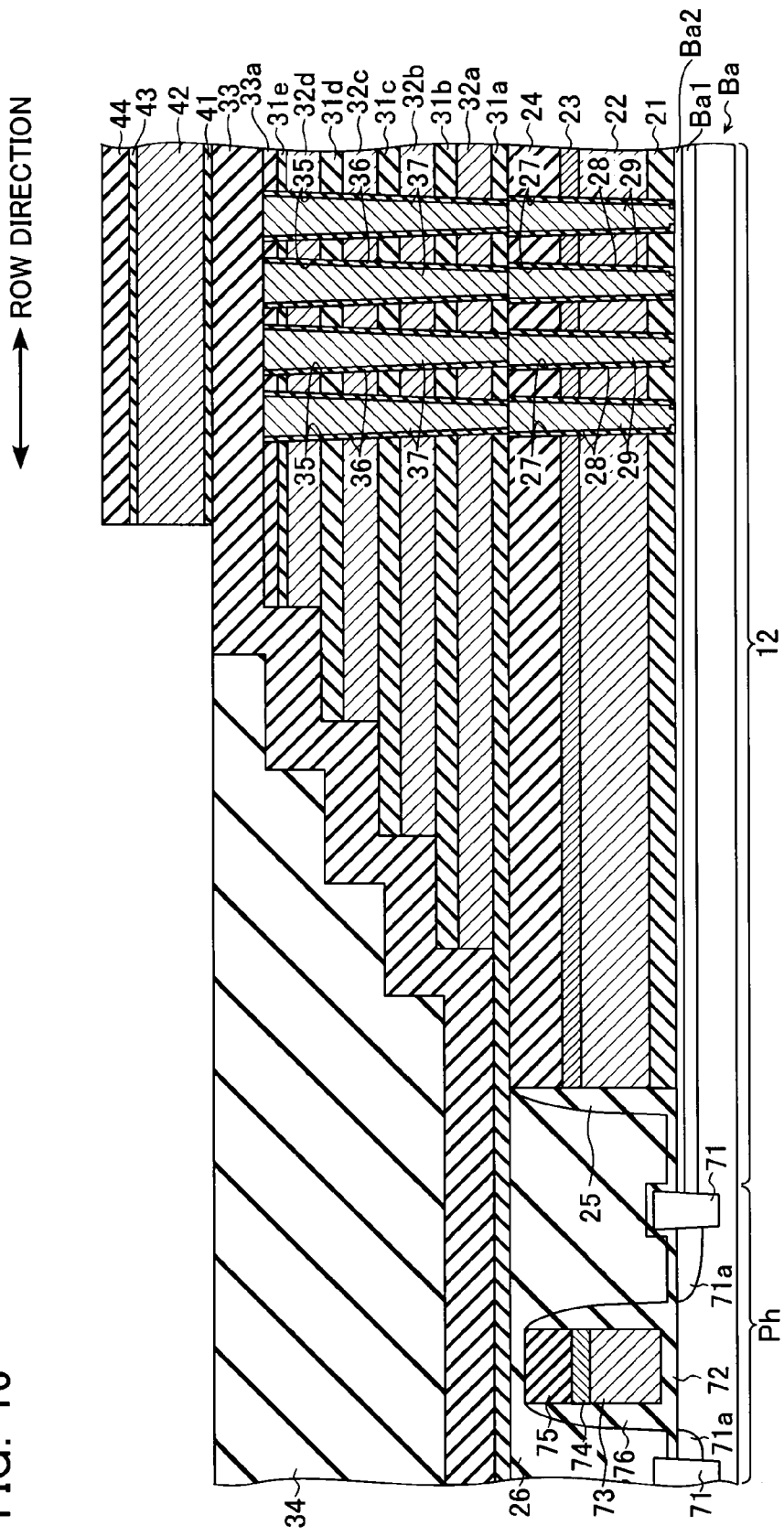
FIG. 16 is a manufacturing process cross sectional-view of the nonvolatile semiconductor storage device in the first embodiment.

As shown in FIG. 16, silicon oxide ($SiO_2$), P+ type polysilicon (p-Si), silicon oxide ($SiO_2$), and silicon nitride (SiN) are sequentially stacked on the memory protection insulating layer 33. After that, lithography and dry etching is performed to form the drain-side first insulating layer 41, the drain-side conductive layer 42, the drain-side second insulating layer 43, and the drain-side isolation/insulating layer 44.

Figure 17:
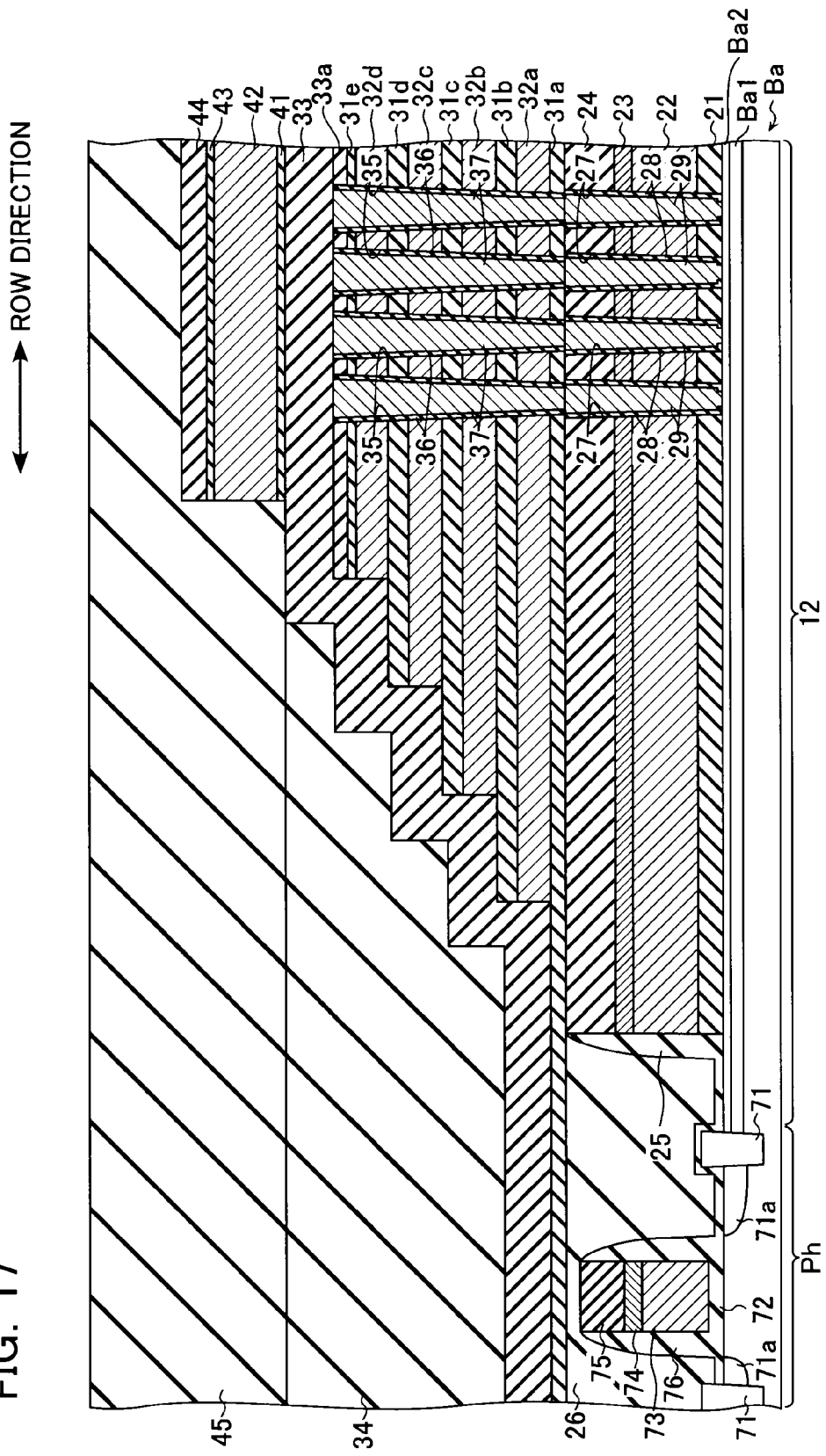
FIG. 17 is a manufacturing process cross sectional-view of the nonvolatile semiconductor storage device in the first embodiment.

Subsequently, as shown in FIG. 17, silicon oxide ($SiO_2$) is deposited on the top face of the drain-side isolation/insulating layer 44 to a predetermined level and, after that, planarized by the CMP process to form the interlayer insulating layer 45.

Figure 18:
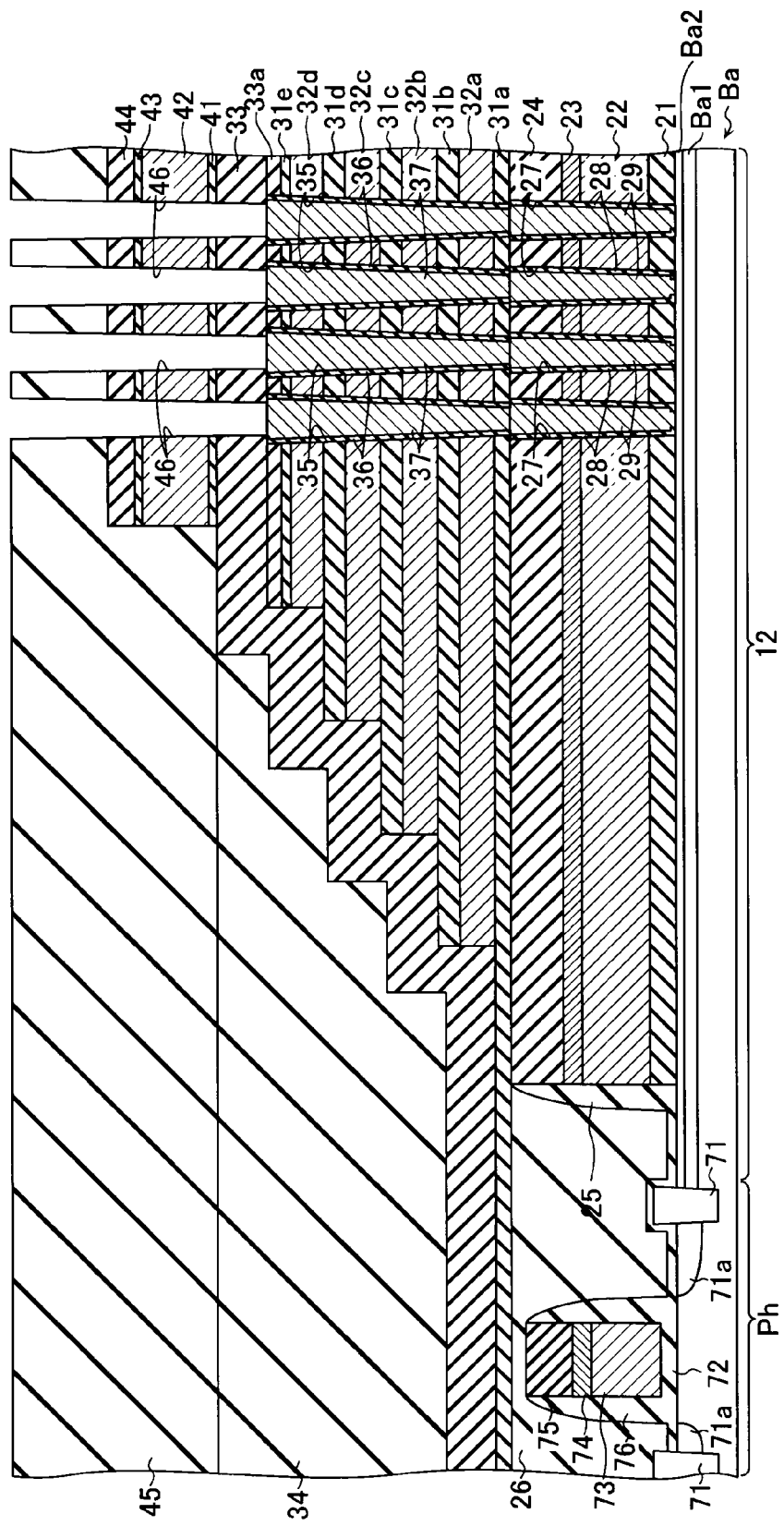
FIG. 18 is a manufacturing process cross sectional-view of the nonvolatile semiconductor storage device in the first embodiment.

As shown in FIG. 18, the drain-side hole 46 is formed so as to penetrate the interlayer insulating layer 45, the drain-side isolation/insulating layer 44, the drain-side second insulating layer 43, the drain-side conductive layer 42, the drain-side first insulating layer 41, and the memory protection insulating layer 33. The drain-side hole 46 is provided in a position aligned with the memory hole 35.

Figure 19:
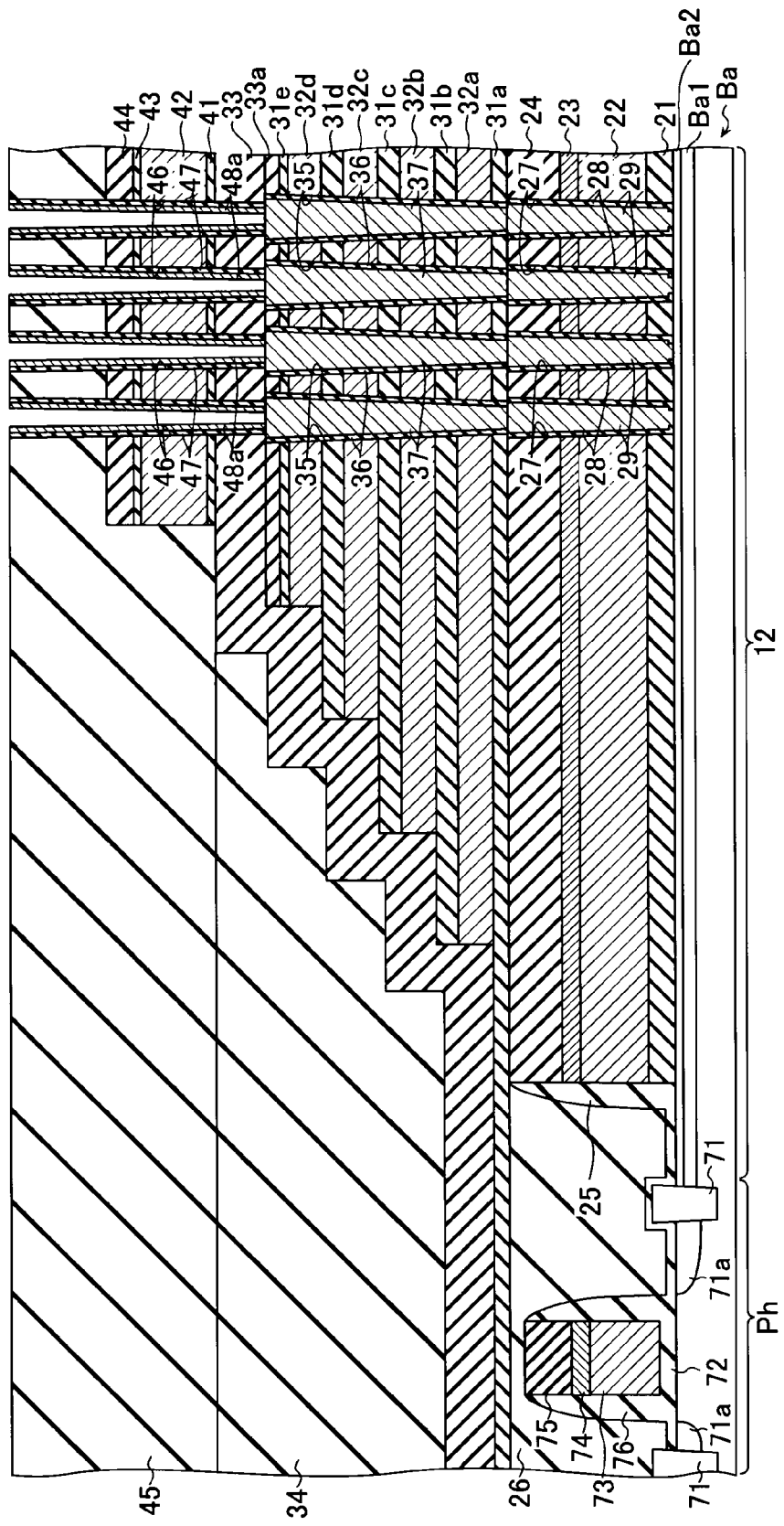
FIG. 19 is a manufacturing process cross sectional-view of the nonvolatile semiconductor storage device in the first embodiment.

Subsequently, as shown in FIG. 19, silicon oxide ($SiO_2$) and amorphous silicon (a-Si) are deposited in the drain-side hole 46. By RIE, the silicon oxide ($SiO_2$) and amorphous silicon (a-Si) formed at the bottom of the drain-side hole 46 are removed. By the process, the drain-side gate insulating layer 47 and the spacer layer 48a are sequentially formed on the side wall facing the drain-side hole 46. After that, the diluted hydrofluoric acid process is performed on the bottom of the drain-side hole 46 to remove a native oxide film.

Figure 20:
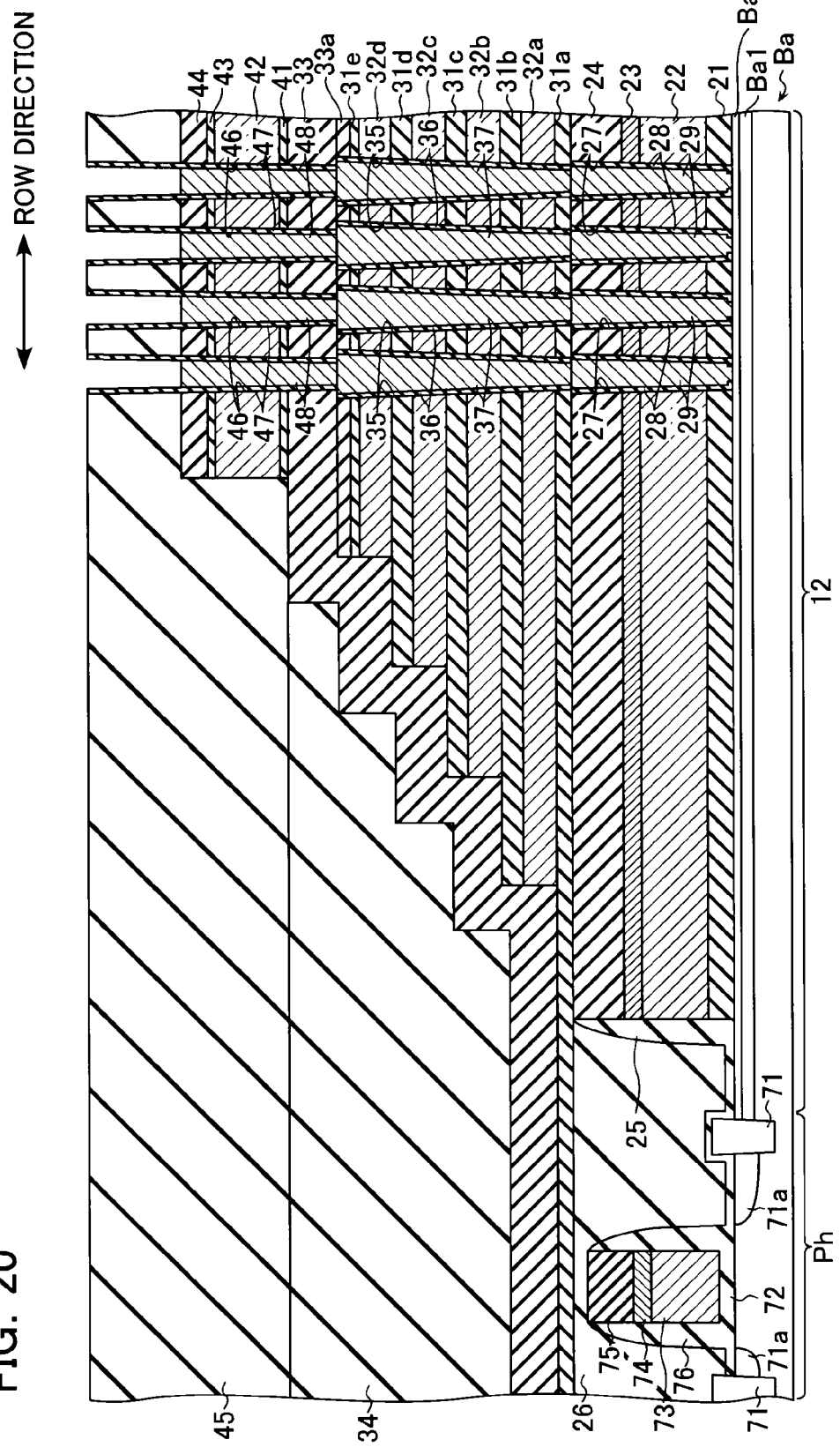
FIG. 20 is a manufacturing process cross sectional-view of the nonvolatile semiconductor storage device in the first embodiment.

As shown in FIG. 20, amorphous silicon (a-Si) is deposited. After that, the RIE process is performed to make the level of the top face of the deposited amorphous silicon almost equal to that of the top face of the drain-side isolation/insulating layer 44, and the heat treatment is performed. By the process, the drain-side columnar semiconductor layer 48 is formed so as to be in contact with the drain-side gate insulating layer 47 in the drain-side hole 46. It is also possible to implant impurity ions at the upper end of the drain-side columnar semiconductor layer 48 to form the upper part of the drain-side columnar semiconductor layer 48 made of N+ type polysilicon.

Figure 21:
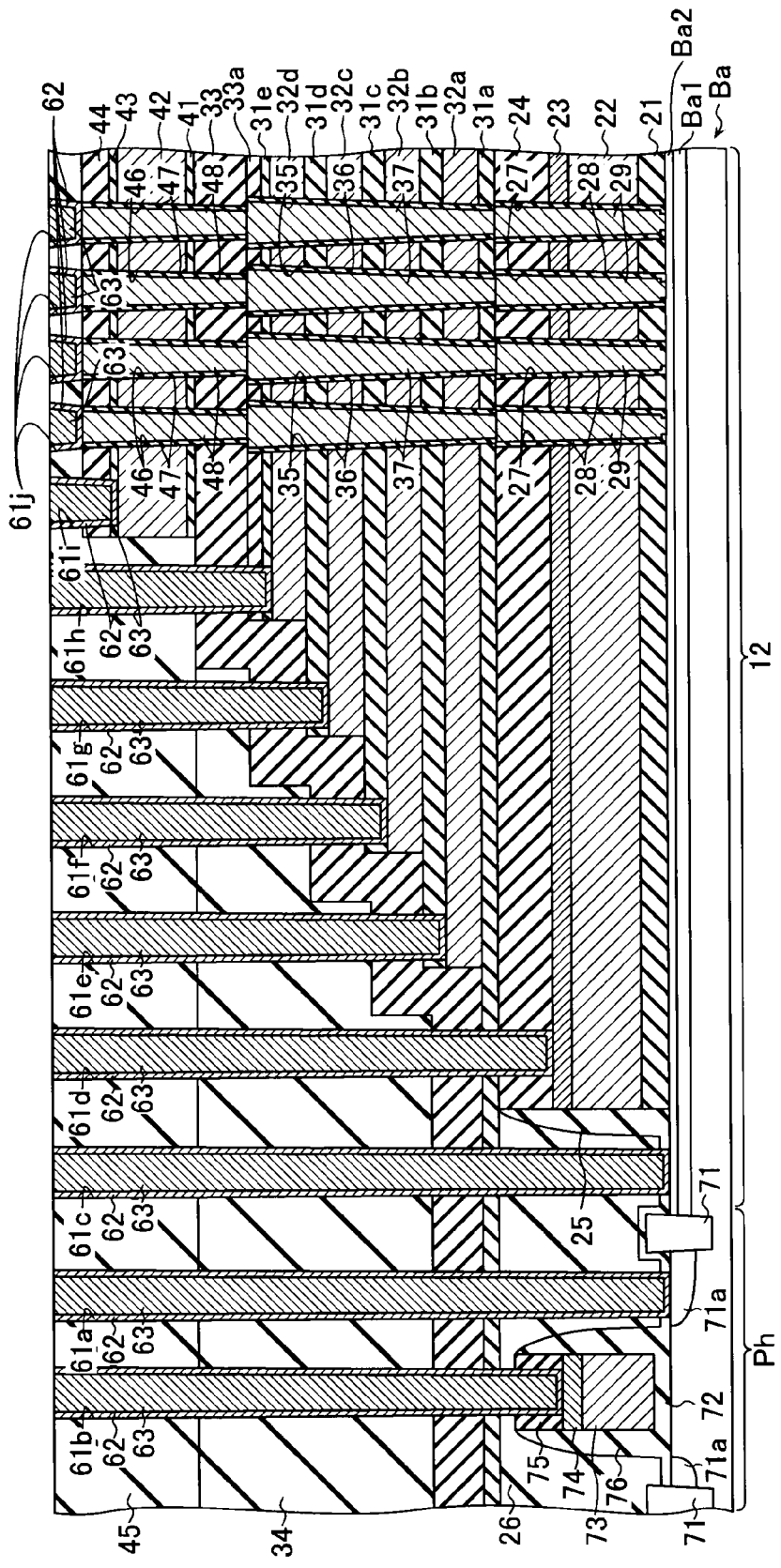
FIG. 21 is a manufacturing process cross sectional-view of the nonvolatile semiconductor storage device in the first embodiment.

Subsequently, as shown in FIG. 21, the plug holes 61a to 61i are formed from the top face of the interlayer insulating layer 45. The plug hole 61a is formed so as to reach the source/drain layer 71a. The plug hole 61b is formed so as to reach the gate metal layer 74. The plug hole 61c is formed so as to reach the n+ region Ba2. The plug hole 61d is formed so as to reach the source-side metal layer 23. The plug holes 61e to 61h are formed so as to reach the first to fourth word line conductive layers 32a to 32d, respectively. The plug hole 61i is formed so as to reach the drain-side conductive layer 42. On the source-side hole 46 functioning as the plug hole 61j, titanium-titanium nitride (Ti—TiN) and tungsten (W) are deposited to form the barrier metal layer 62 and the plug conductive layer 63.

Figure 22:
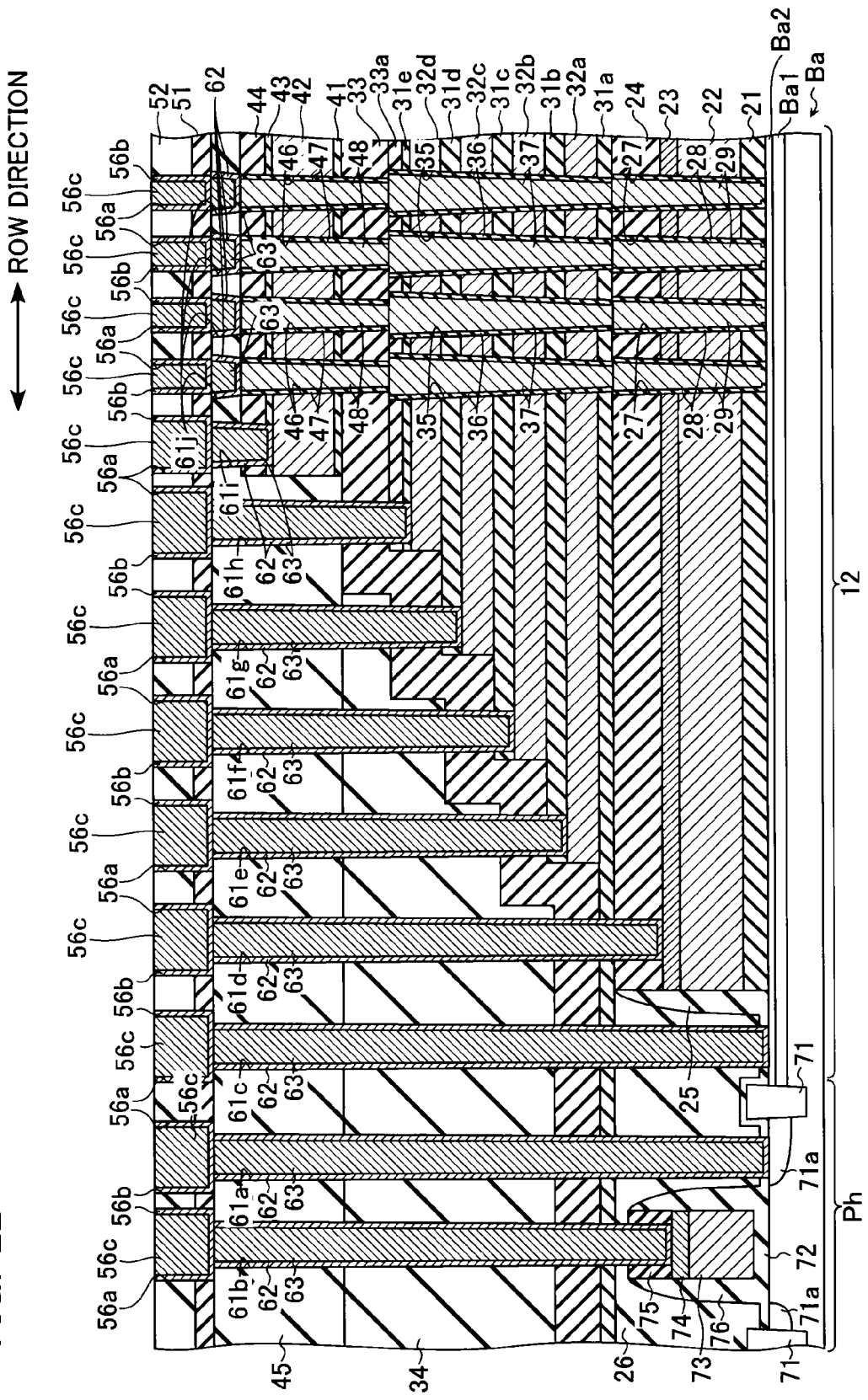
FIG. 22 is a manufacturing process cross sectional-view of the nonvolatile semiconductor storage device in the first embodiment.

Subsequently, as shown in FIG. 22, by depositing silicon nitride (SiN) and silicon oxide ($SiO_2$) on the top face of the interlayer insulating layer 45, the wiring first insulating layer 51 and the wiring second insulating layer 52 are formed. The wiring first groove 56a is formed so as to penetrate the wiring second insulating layer 52 and the wiring first insulating layer 51 in a position aligned with the plug holes 61a to 61j. The wiring first groove 56a is formed so as to have an opening extending in the column direction. Subsequently, in the wiring first groove 56a, titanium-titanium nitride (Ti—TiN) and tungsten (W) are deposited to form the barrier metal layer 56b and the wiring first conductive layer 56c.

After the process shown in FIG. 22, by depositing silicon oxide ($SiO_2$) on the top face of the wiring second insulating layer 52, the wiring third insulating layer 53 is formed. Next, the wiring plug hole 57a is formed so as to penetrate the wiring third insulating layer 53. The wiring plug hole 57a is formed in a position aligned with the first wiring groove 56a. By depositing titanium-titanium nitride (Ti—TiN) and tungsten (W) in the wiring plug hole 57a, the barrier metal layer 57b and the wiring plug conductive layer 57c are formed.

Subsequently, by sequentially depositing silicon nitride (SiN) and silicon oxide ($SiO_2$) on the top face of the wiring third insulating layer 53, the wiring fourth insulating layer 54 and the wiring fifth insulating layer 55 are formed. After that, the wiring second groove 58a is formed so as to penetrate the wiring fifth insulating layer 55 and the wiring fourth insulating layer 54. The wiring second groove 58a is formed in a position aligned with the wiring plug hole 57a. By depositing titanium-titanium nitride (Ti—TiN) and tungsten (W) in the wiring second groove 58a, the barrier metal layer 58b and the wiring second conductive layer 58c are formed. By the process, the nonvolatile semiconductor storage device 100 of the first embodiment shown in FIG. 4 is formed.

(Effect of Nonvolatile Semiconductor Storage Device 100 of First Embodiment)

The effect of the nonvolatile semiconductor storage device 100 of the first embodiment will be described. The nonvolatile semiconductor storage device 100 of the first embodiment can realize high integration as already shown in the stack structure. As described in the manufacturing process, in the nonvolatile semiconductor storage device 100, layers of the memory transistors MTrmn, layers of the source-side selection transistors SSTrmn, and layers of the drain-side selection transistor layers SDTrmn can be manufactured by a predetermined number of lithography processes irrespective of the number of layers stacked. That is, the nonvolatile semiconductor storage device 100 can be manufactured at low cost.

In the nonvolatile semiconductor storage device 100 of the first embodiment of the invention, on the top face of the source-side conductive layer 22, the source-side metal layer 23 made of tungsten silicide (WSi) is formed. Therefore, in the nonvolatile semiconductor storage device 100 of the first embodiment, wiring resistance can be reduced by the source-side metal layer 23.

That is, the nonvolatile semiconductor storage device of the first embodiment in which wiring resistance is reduced by the source-side metal layer 23 can execute stable operation.

Second Embodiment

Concrete Configuration of Nonvolatile Semiconductor Storage Device in Second Embodiment A concrete configuration of a nonvolatile semiconductor storage device as a second embodiment of the invention will be described with reference to FIG. 23. In the second embodiment, the same reference numerals are designated to components similar to those of the first embodiment, and their description will not be repeated.

Figure 23:
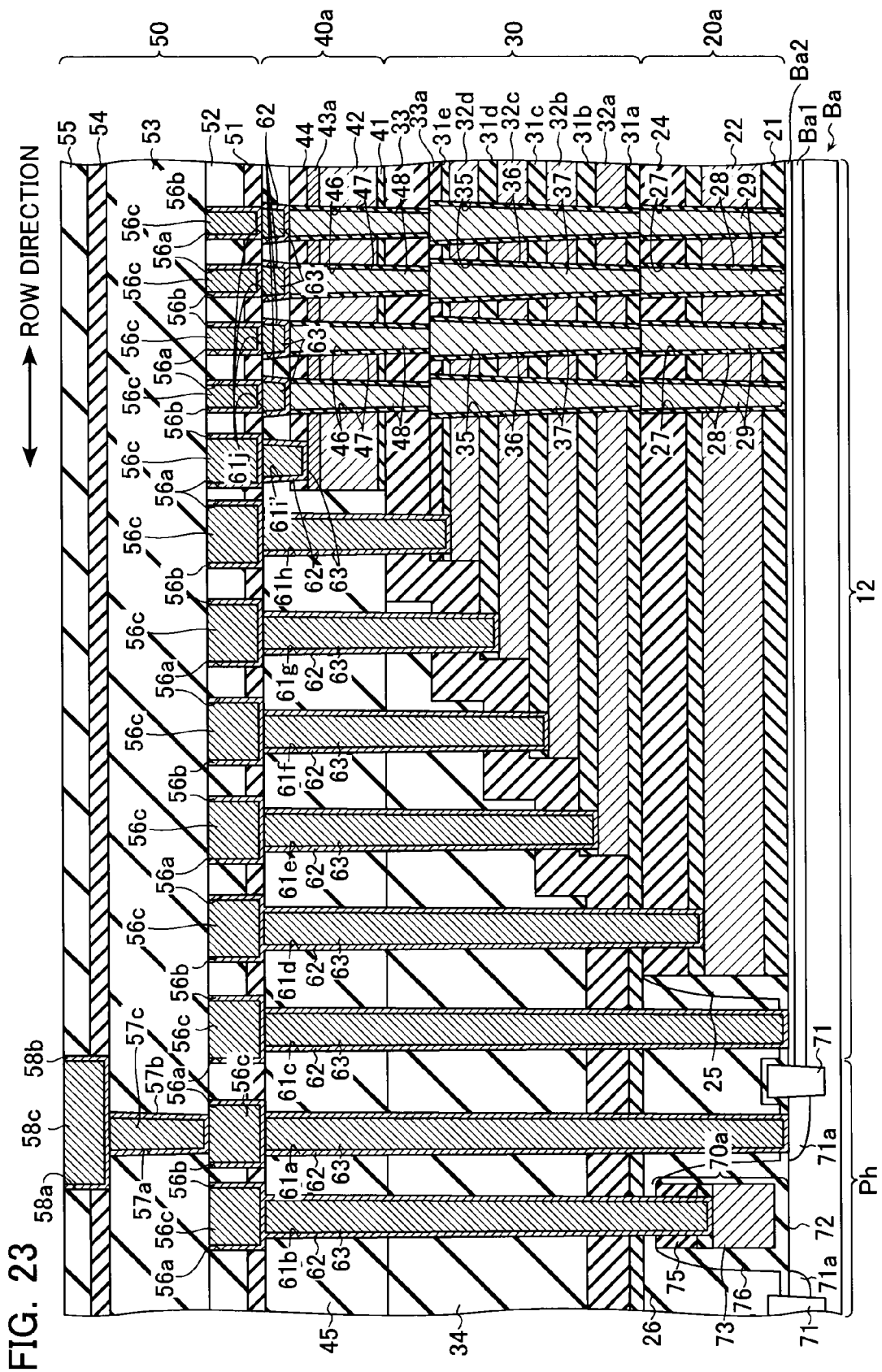
FIG. 23 is a cross sectional-view of a nonvolatile semiconductor storage device in a second embodiment.

As shown in FIG. 23, the nonvolatile semiconductor storage device of the second embodiment has, in the memory transistor region 12, a source-side selection transistor layer 20a and a drain-side selection transistor layer 40a which are different from those of the first embodiment. The nonvolatile semiconductor storage device of the second embodiment has, in the periphery region Ph, a peripheral transistor layer 70a different from that of the first embodiment.

The drain-side selection transistor layer 40a has a drain-side metal layer 43a in place of the drain-side second insulating layer 43. In other words, the drain-side metal layer 43a is formed so as to be in contact with the top face of the drain-side conductive layer 42.

The drain-side metal layer 43a is formed in a line shape repeatedly provided in the column direction and extending in the row direction. The drain-side metal layer 43a is made of tungsten silicide (WSi). The drain-side hole 46 is formed so as to penetrate the drain-side metal layer 43a.

The configuration of plug holes 61d' and 61i' in the second embodiment is different from that of the first embodiment. The plug hole 61d' is formed so as to reach the source-side conductive layer 22. Specifically, the plug conductive layer 63 in the plug hole 61d' is formed so as to be in contact with the top face of the source-side conductive layer 22 via the barrier metal layer 62. The plug hole 61i' is formed so as to reach the drain-side metal layer 43a. the plug conductive layer 63 in the plug hole 61i' is formed so as to be in contact with the top face of the drain-side metal layer 43a via the barrier metal layer 62.

(Effect of Nonvolatile Semiconductor Storage Device in Second Embodiment)

The effect of the nonvolatile semiconductor storage device of the second embodiment will be described. The nonvolatile semiconductor storage device of the second embodiment can realize high integration and can be manufactured at low cost in a manner similar to the first embodiment.

In the nonvolatile semiconductor storage device of the second embodiment, the drain-side metal layer 43 made of tungsten silicide (WSi) is formed on the top face of the drain-side conductive layer 42. Therefore, in the nonvolatile semiconductor storage device of the second embodiment, wiring resistance can be reduced by the drain-side metal layer 43a.

Third Embodiment

Concrete Configuration of Nonvolatile Semiconductor Storage Device in Third Embodiment A concrete configuration of a nonvolatile semiconductor storage device as a third embodiment of the invention will be described with reference to FIG. 24. In the third embodiment, the same reference numerals are designated to components similar to those of the first embodiment, and their description will not be repeated.

Figure 24:
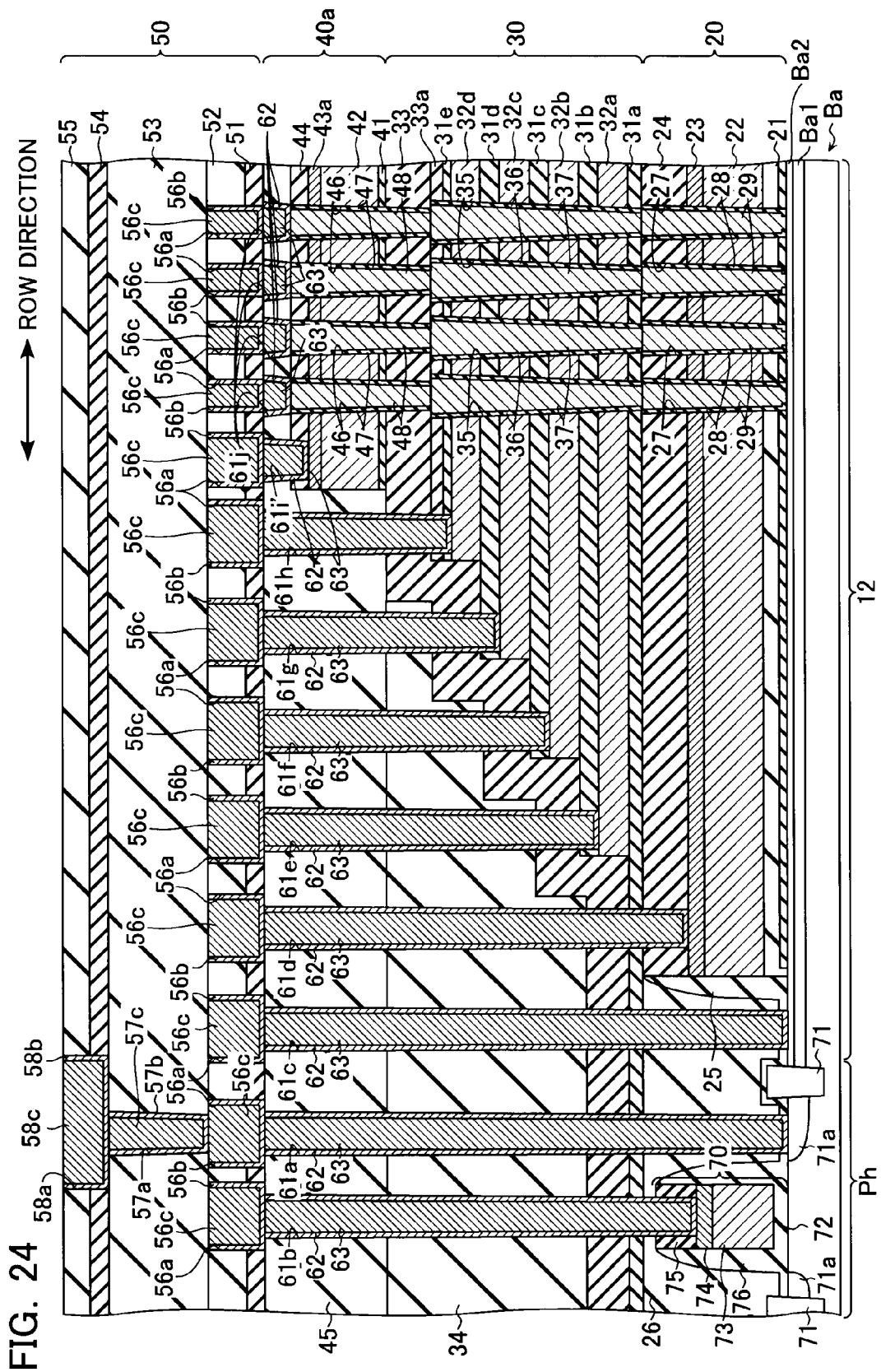
FIG. 24 is a cross sectional-view of a nonvolatile semiconductor storage device in a third embodiment.

As shown in FIG. 24, the nonvolatile semiconductor storage device of the third embodiment has, in the memory transistor region 12, the source-side selection transistor layer 20, the memory transistor layer 30, a drain-side selection transistor layer 40a, and the wiring layer 50 which are sequentially stacked on the semiconductor substrate Ba. The nonvolatile semiconductor storage device of the third embodiment has, in the periphery region Ph, the peripheral transistor layer 70. That is, the nonvolatile semiconductor storage device of the third embodiment has the characteristics of the first and second embodiments.

(Effect of Nonvolatile Semiconductor Storage Device in Third Embodiment)

The effect of the nonvolatile semiconductor storage device of the third embodiment will be described. The nonvolatile semiconductor storage device of the third embodiment produces effects similar to those of the first and second embodiments.

Fourth Embodiment

Concrete Configuration of Nonvolatile Semiconductor Storage Device in Fourth Embodiment A concrete configuration of a nonvolatile semiconductor storage device as a fourth embodiment of the invention will be described with reference to FIG. 25. In the fourth embodiment, the same reference numerals are designated to components similar to those of the first embodiment, and their description will not be repeated.

Figure 25:
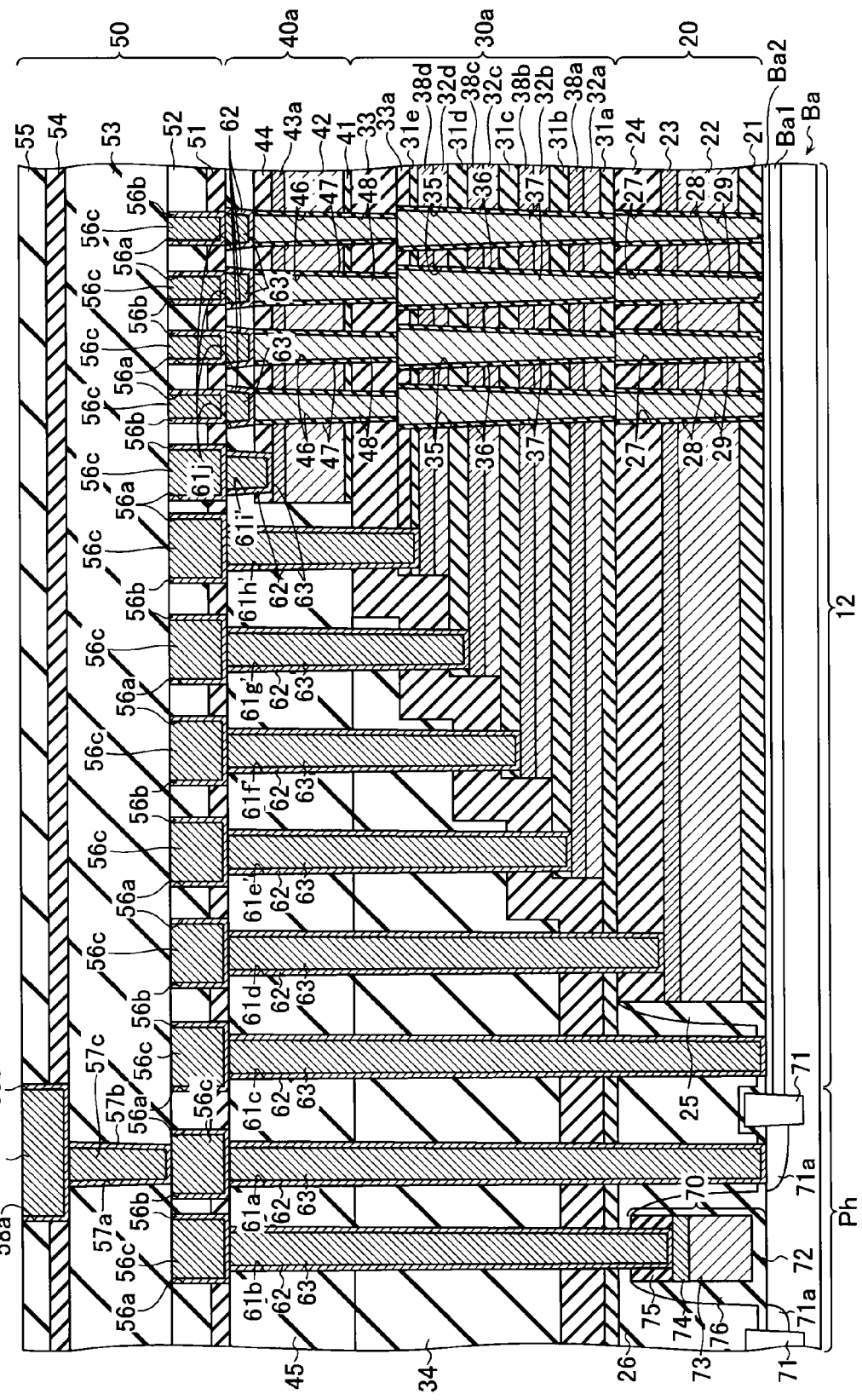
FIG. 25 is a cross sectional-view of a nonvolatile semiconductor storage device in a fourth embodiment.

As shown in FIG. 25, the nonvolatile semiconductor storage device of the fourth embodiment has a memory transistor layer 30a which is different from the memory transistor layer 30 in the third embodiment.

The memory transistor layer 30a has, different from the first to third embodiments, first to fourth word line metal layers 38a to 38d between the first to fourth word line conductive layers 32a to 32d and the second to fifth inter-word-line insulating layers 31b to 31e, respectively. In other words, the first to fourth word line metal layers 38a to 38d are formed in contact with the top faces of the first to fourth word line conductive layers 32a to 32d, respectively.

The first to fourth word line metal layers 38a to 38d are formed so as to extend two-dimensionally in the row and column directions. The first to fourth word line metal layers 38a to 38d are made of tungsten silicide (WSi). The memory hole 35 is formed so as to penetrate the first to fourth word line metal layers 38a to 38d.

The configuration of the plug holes 61e' to 61h' in the fourth embodiment is different from that of the first to third embodiments. The plug holes 61e' to 61h' are formed so as to reach the first to fourth word line metal layers 38a to 38d. The plug conductive layer 63 in the plug holes 61e' to 61h' is formed so as to be in contact with the top faces of the first to fourth word line metal layers 38a to 38d via the barrier metal layer 62.

(Effect of Nonvolatile Semiconductor Storage Device in Fourth Embodiment)

The effect of the nonvolatile semiconductor storage device of the fourth embodiment will be described. The nonvolatile semiconductor storage device of the fourth embodiment produces effects similar to those of the first to third embodiments. In the nonvolatile semiconductor storage device of the fourth embodiment, the first to fourth word line metal layers 38a to 38d made of tungsten silicide (WSi) are formed on the top faces of the first to fourth word line conductive layers 32a to 32d, respectively. The plug conductive layer 63 is formed on the top face of the first to fourth word line metal layers 38a to 38d via the barrier metal layer 62. Therefore, in the nonvolatile semiconductor storage device of the fourth embodiment, wiring resistance can be reduced by the first to fourth word line metal layers 38a to 38d.

Other Embodiments

Although embodiments of the nonvolatile semiconductor storage device have been described above, the present invention is not limited to the foregoing embodiments but various changes, additions, replacement, or the like are possible without departing from the spirit of the invention.

For example, in the foregoing embodiments, the source-side metal layer 23, the first to fourth memory metal layers 38a to 38d, and the drain-side metal layer 43a are made of tungsten silicide (WSi). Alternately, a silicide layer made of polymetal using tungsten or a metal other than tungsten may be employed. For example, the source-side metal layer 23, the first to fourth memory metal layers 38a to 38d, and the drain-side metal layer 43a may be made of titanium silicide (TiSi).

Figure 26:
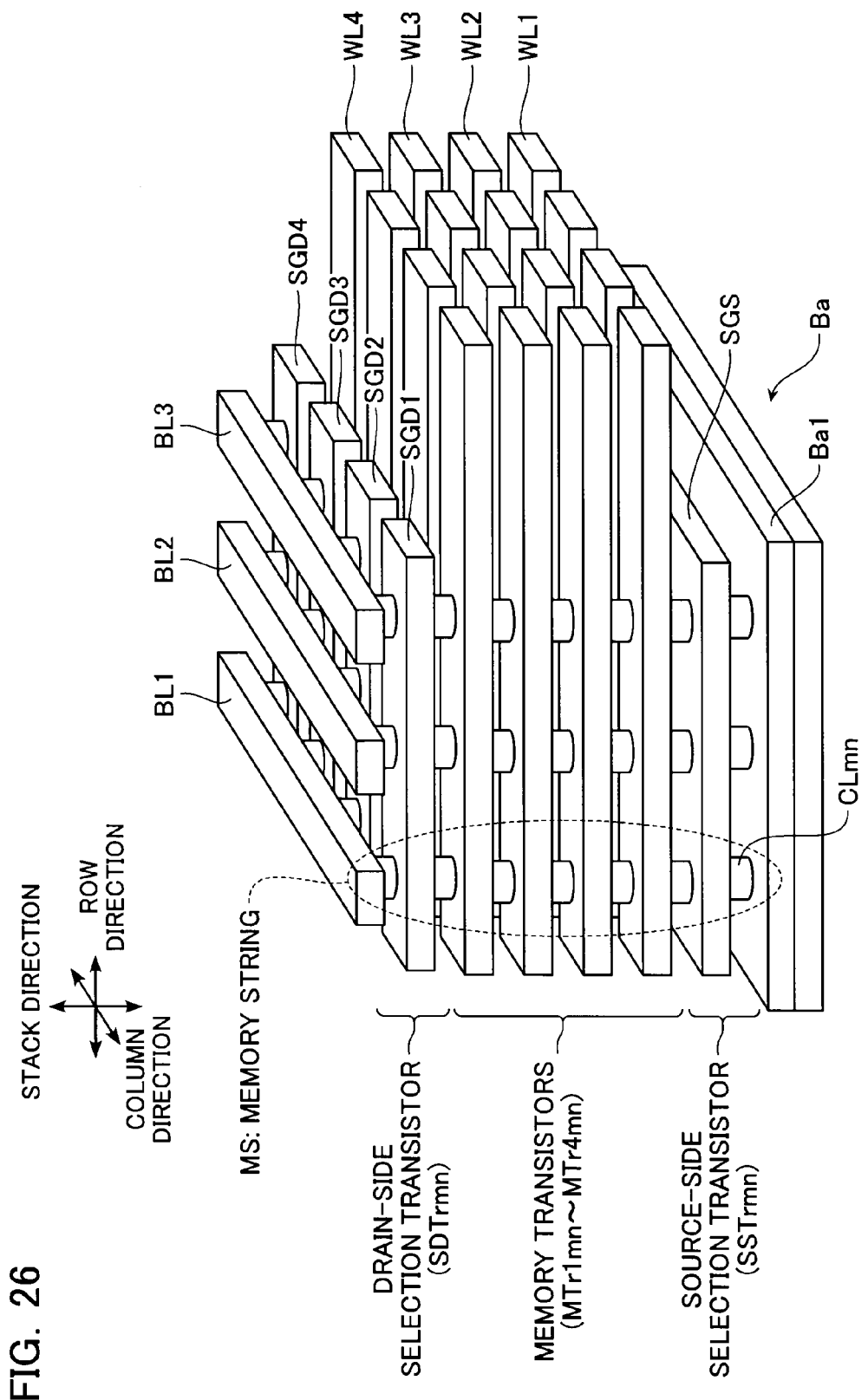
FIG. 26 is a partial schematic perspective view of a memory transistor region 12 of a nonvolatile semiconductor storage device as an other embodiment.

For example, in the foregoing embodiments, the word lines WL1 to WL4 (the first to fourth word line conductive layers 32a to 32d) are formed so as to extend two-dimensionally in the row and column directions. However, as shown FIG. 26, the word lines WL1 to WL4 may have a stripe shape extending in the row direction and repeatedly provided in the column direction.

What is claimed is:

1. A nonvolatile semiconductor storage device comprising:
a plurality of memory strings in which a plurality of electrically rewritable memory cells are connected in series, the memory strings comprising:
a columnar semiconductor layer extending in a direction perpendicular to a substrate;
a first conductive layer sandwiching a charge storing layer with the columnar semiconductor layer;
a second conductive layer positioned below the first conductive layer and sandwiching a first insulating layer with the columnar semiconductor layer;
a third conductive layer positioned above the first conductive layer and sandwiching a second insulating layer with the columnar semiconductor layer; and
a metal layer in contact with at least one of the first, second, and third conductive layers,
the first conductive layer, the second conductive layer, and the third conductive layer being made of polysilicon.

2. The nonvolatile semiconductor storage device according to claim 1, wherein the metal layer is in contact with a top face of the first conductive layer.

3. The nonvolatile semiconductor storage device according to claim 1, wherein the metal layer is in contact with a top face of the second conductive layer.

4. The nonvolatile semiconductor storage device according to claim 2, wherein the metal layer is in contact with a top face of the second conductive layer.

5. The nonvolatile semiconductor storage device according to claim 1, wherein the metal layer is in contact with a top face of the third conductive layer.

6. The nonvolatile semiconductor storage device according to claim 2, wherein the metal layer is in contact with a top face of the third conductive layer.

7. The nonvolatile semiconductor storage device according to claim 3, wherein the metal layer is in contact with a top face of the third conductive layer.

8. The nonvolatile semiconductor storage device according to claim 4, wherein the metal layer is in contact with a top face of the third conductive layer.

9. The nonvolatile semiconductor storage device according to claim 1, wherein the metal layer is made of tungsten silicide or titanium silicide.

10. A nonvolatile semiconductor storage device comprising:
a plurality of memory strings in which a plurality of electrically rewritable memory cells are connected in series, the memory strings comprising:
a columnar semiconductor layer extending in a direction perpendicular to a substrate;
a conductive layer sandwiching a charge storing layer with the columnar semiconductor layer; and
a metal layer in contact with a top face of the conductive layer,
the conductive layer being made of polysilicon.

11. The nonvolatile semiconductor storage device according to claim 10, wherein the metal layer is made of tungsten silicide or titanium silicide.

* * * * *